(12) United States Patent
Schroegmeier et al.

(10) Patent No.: US 7,876,598 B2
(45) Date of Patent: Jan. 25, 2011

(54) APPARATUS AND METHOD FOR DETERMINING A MEMORY STATE OF A RESISTIVE N-LEVEL MEMORY CELL AND MEMORY DEVICE

(75) Inventors: Peter Schroegmeier, Munich (DE); Stefan Dietrich, Tuerkenfeld (DE)

(73) Assignee: Qimonda AG, Munich (DE)

( * ) Notice: Subject to any disclaimer, the term of this patent is extended or adjusted under 35 U.S.C. 154(b) by 435 days.

(21) Appl. No.: 12/039,633

(22) Filed: Feb. 28, 2008

(65) Prior Publication Data

US 2009/0219756 A1 Sep. 3, 2009

(51) Int. Cl.
*G11C 11/00* (2006.01)
(52) U.S. Cl. .................. 365/148; 365/163; 365/189.15; 365/189.09; 365/185.03
(58) Field of Classification Search ............. 365/148 O, 365/163 X, 189.011, 189.15 X, 189.05, 189.09 X, 365/185.03 X, 148, 163, 189.15, 189.09, 365/185.03
See application file for complete search history.

(56) References Cited

U.S. PATENT DOCUMENTS

| | | | |
|---|---|---|---|
| 5,831,900 A | 11/1998 | Miyamoto | |
| 6,028,793 A | 2/2000 | Manstretta et al. | |
| 6,188,615 B1 * | 2/2001 | Perner et al. | 365/158 |
| 6,717,848 B2 | 4/2004 | Kim et al. | |
| 7,133,311 B2 | 11/2006 | Liu | |
| 7,196,924 B2 | 3/2007 | Lai et al. | |
| 7,304,889 B2 * | 12/2007 | Goldman et al. | 365/185.03 |
| 7,440,332 B2 * | 10/2008 | Gallo et al. | 365/185.22 |
| 7,580,297 B2 * | 8/2009 | Nirschl et al. | 365/189.07 |
| 2009/0116280 A1 * | 5/2009 | Parkinson et al. | 365/163 |

* cited by examiner

*Primary Examiner*—VanThu Nguyen
(74) *Attorney, Agent, or Firm*—John S. Economou

(57) ABSTRACT

A determination of the memory state of a resistive n-level memory cell is described. The determination includes charging or discharging a read capacity of the memory cell by applying a voltage between a first electrode and a second electrode of the resistive memory cell. A voltage at the second electrode is compared to a reference voltage to obtain a comparison signal. The comparison signal is sampled at, at least, (n−1) time instants during the charge or discharge of the read capacity to obtain sampling values. The memory state of the memory cell can be determined based upon the sampling values.

24 Claims, 13 Drawing Sheets

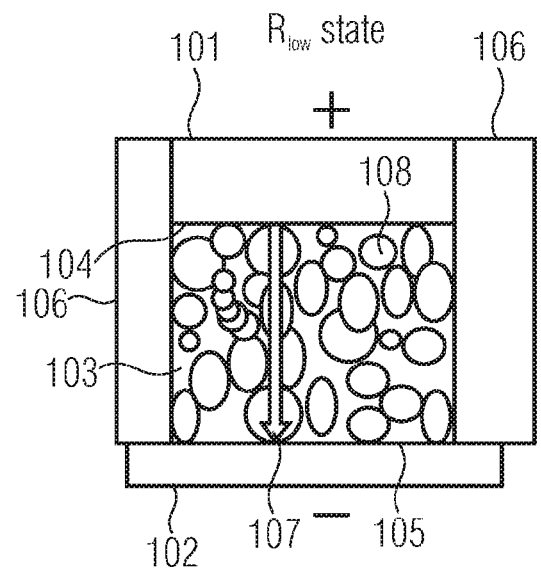
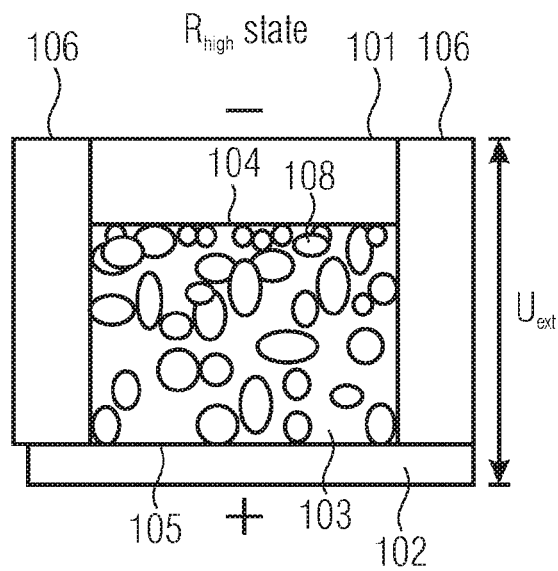
FIG 1A    FIG 1B
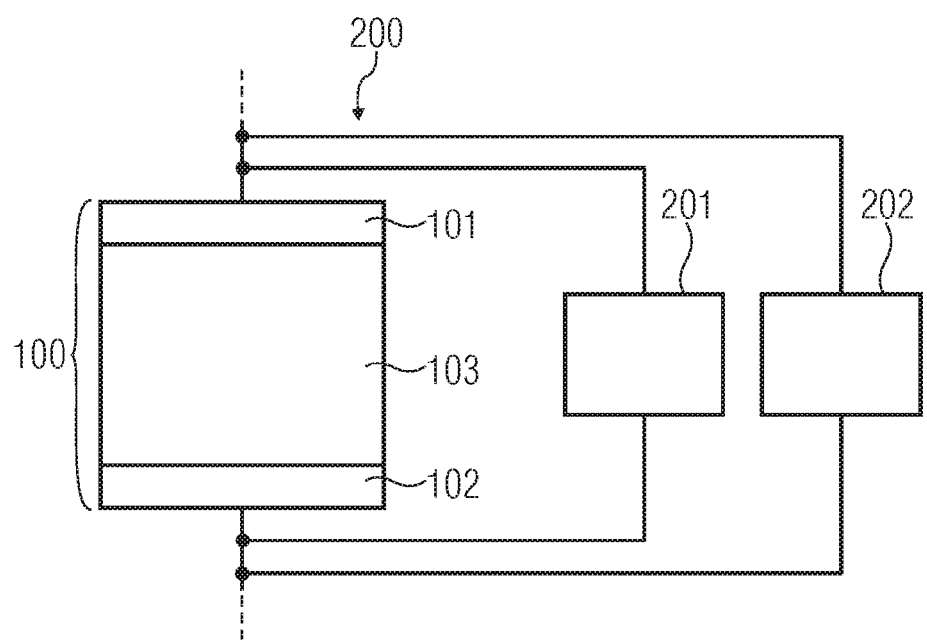
FIG 2

APPARATUS AND METHOD FOR DETERMINING A MEMORY STATE OF A RESISTIVE N-LEVEL MEMORY CELL AND MEMORY DEVICE

BACKGROUND

Embodiments of the present application relate to the determination of the memory state of a resistive n-level memory cell and a memory device.

BRIEF DESCRIPTION OF THE DRAWINGS

In the following, embodiments of the present invention are described in more detail with respect to the figures among which:

FIG. 1A shows a schematic cross-sectional view of a solid electrolyte memory cell set to a lower resistive switching state;

FIG. 1B shows a schematic cross-sectional view of a solid electrolyte memory cell set to a higher resistive switching state;

FIG. 2 shows a schematic block diagram of an arrangement illustrating a possibility to determine the memory state of a multi-level memory cell.

DETAILED DESCRIPTION OF ILLUSTRATIVE EMBODIMENTS

Figure 3:
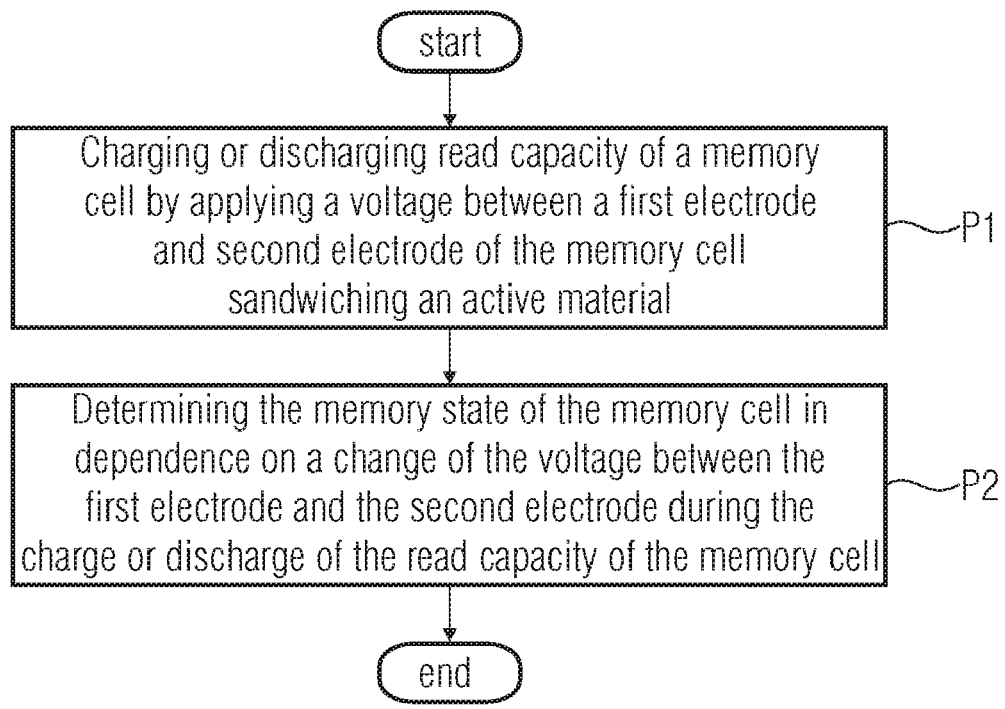
FIG. 3 shows a flow chart of the determination process of the arrangement of FIG. 2.

Within the figures, equal elements or elements of equal functionality are indicated by equal or similar reference signs, and descriptions regarding the elements presented relating to preceding figures are not repeated within the description of succeeding figures.

Before describing embodiments of the present invention for a memory device and its operation in determining the memory state of a resistive n-level memory cell, with respect to FIGS. 1-5, embodiments for an n-level memory cell and its discharge behavior upon appliance of a voltage across the memory cell and the possibility of exploiting this behavior in order to determine the memory state based upon the change of the memory cell's voltage during the charge or discharge is described in more detail. However, it is noted that the examples presented in FIGS. 1-5 are merely for illustrative purposes as far as, for example, the type of memory cell and the number of possible memory states is concerned.

In particular, FIGS. 1A and 1B show a CBRAM cell (Conductive Bridging Random Access Memory) as an example for a resistive memory cell. A CBRAM cell is a solid electrolyte device. The basic principle underlying CBRAM devices will be explained with respect to FIGS. 1A and 1B. However, again, it is noted that the embodiments of the present application described in more detail below may also be applied to other types of resistive memory devices like PCRAM (Phase Changing Random Access Memory) devices, or ORAM (Organic Random Access Memory) devices.

As shown in FIG. 1A, a CBRAM cell includes a first electrode 101, a second electrode 102, and a solid electrolyte block (in the following also referred to as ion conductor block) 103 which is the active material and which is sandwiched between the first electrode 101 and the second electrode 102. The first electrode 101 contacts a first surface 104 of the ion conductor block 103, the second electrode 102 contacts a second surface 105 of the ion conductor block 103. The ion conductor block 103 may be isolated against its environment by an isolation structure 106. The first surface 104 usually is the top surface, the second surface 105 the bottom surface of the ion conductor 103. In the same way, the first electrode 101 generally is the top electrode, and the second electrode 102 the bottom electrode of the CBRAM cell. One of the first electrode 101 and the second electrode 102 is a reactive electrode, the other one an inert electrode. Here, the first electrode 101 is the reactive electrode, and the second electrode 102 is the inert electrode. In this example, the first electrode 101 includes silver (Ag), the ion conductor block 103 includes silver-doped chalcogenide material, and the isolation structure 106 includes $SiO_2$.

If a voltage as indicated in FIG. 1A is applied across the ion conductor block 103, a redox reaction is initiated which drives $Ag^+$ ions out of the first electrode 101 into the ion conductor block 103 where they are reduced to Ag, thereby forming Ag rich clusters 108 within the ion conductor block 103. If the voltage applied across the ion conductor block 103 is applied for a long period of time, the size and the number of Ag rich clusters 108 within the ion conductor block 103 is increased to such an extent that a conductive bridge 107 between the first electrode 101 and the second electrode 102 is formed. In case that a voltage is applied across the ion conductor 103 as shown in FIG. 1b (inverse voltage compared to the voltage applied in FIG. 1a), a redox reaction is initiated which drives $Ag^+$ ions out of the ion conductor block 103 into the first electrode 101 where they are reduced to Ag. As a consequence, the size and the number of Ag rich clusters 108 within the ion conductor block 103 is reduced, thereby erasing the conductive bridge 107.

In order to determine the current memory status of the CBRAM cell, for example, a sensing current is routed through the CBRAM cell. The sensing current experiences a high resistance in case no conductive bridge 107 exists within the CBRAM cell, and experiences a low resistance in case a conductive bridge 107 exists within the CBRAM cell. Of course, the resistance of the CBRAM cell experienced by the sensing current may be gradually set during the programming of the cell as described in the preceding paragraph. In other words, the cell of FIGS. 1A and 1B may be dedicated for assuming one of several resistance states, each corresponding to a different one of logical states, and the number of states possible exceeding two. By this measure, the CBRAM set of FIGS. 1A and 1B may be used as an n-level memory cell. For example, the memory cells of FIGS. 1A and 1B may act as a 4-level memory cell, wherein the low resistive state shown in FIG. 1A may represent a logical "00" whereas the high resistive stage shown in FIG. 1B may correspond to a logical "11". In this regard, it is noted that the assumption of the memory cell having four levels is maintained throughout the description of the drawings, although the number of possible memory states n may be any number greater than 2 and is also not restricted to powers of 2. Moreover, the memory status detection may also be carried out using sensing voltages, as described in the following.

FIG. 2 shows an arrangement capable of determining the memory state of a resistive n-level memory cell. The device 200 shown in FIG. 2 is capable of determining the memory state of a resistive memory cell 100 including a first electrode 101, a second electrode 102 and an active material (for example, a solid electrolyte block) 103 being arranged between the first electrode 101 and the second electrode 102. The device 200 includes a voltage supplying means 201 capable of generating a voltage between the first electrode 101 and the second electrode 102, and a voltage determining means 202 determining a change of voltage occurring during the charge or discharge of a read capacity of the memory cell 100 via the active material 103 of the memory cell 100, the change of voltage representing the memory state to be detected. In particular, and as shown in FIG. 2, the voltage determining means 202 may be connected to both electrodes 101 and 102, or just one of the electrodes such as the second electrode 102 in order to determine the potential change of the second electrode due to the voltage change across the active material 103, against some reference potential such as ground or source potential.

The voltage supplying means 201 may comprise pins or terminals allowing the appliance of an external supply voltage to the cell 100. However, the voltage supplying means 201 may also comprise a DC-DC converter, a band-gap circuit or the like. The voltage determining means 202 may be embodied as described in the following figures. That is, the voltage determining means 202 may be a sense amplifier, a triggering circuit and an evaluation circuit as described with respect to FIG. 6, or a determination circuit and an evaluation circuit as described with respect to FIG. 8 although other configurations are also possible as will be described in the following.

FIG. 3 shows a way of determining the memory state of a resistive memory cell by way of the arrangement of FIG. 2. In a first process P1, a read capacity is charged or discharged over an active material arranged between a first electrode and a second electrode of a memory cell by applying a voltage between the first electrode and the second electrode. In a second process P2, the memory state of the memory cell is determined in dependence on a change of the voltage between the first electrode and the second electrode occurring during the charge or discharge of the read capacity.

Figure 4:
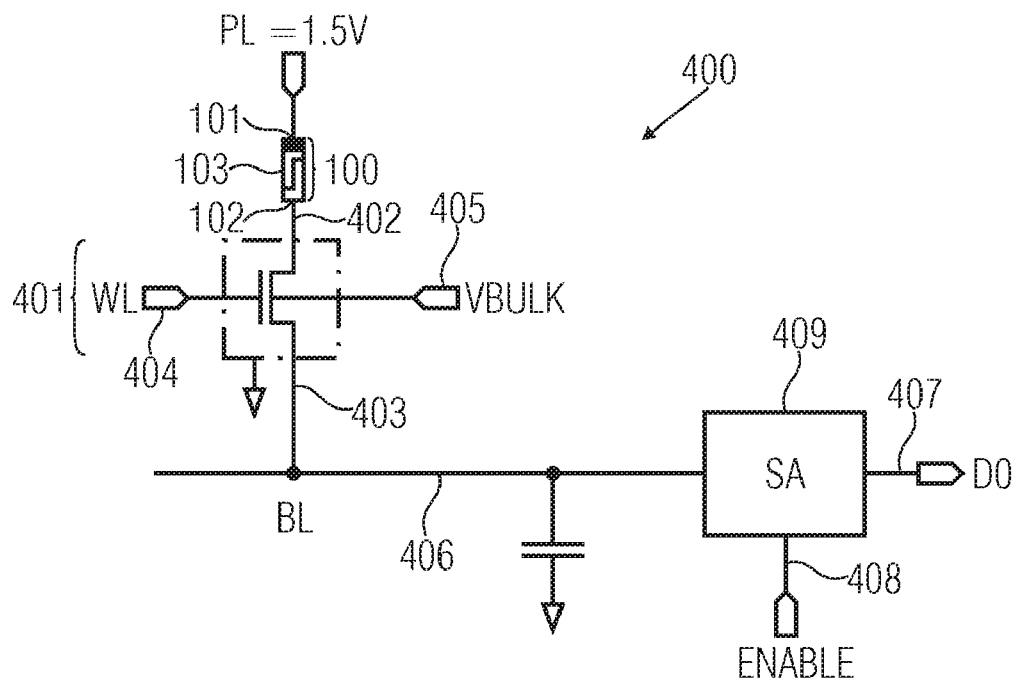
FIG. 4 shows a schematic drawing of a circuit embodying the arrangement of FIG. 2.

FIG. 4 shows possible circuitry for a memory device enabling the steps of FIG. 3. The circuitry 400 includes a resistive memory cell 100 having a first electrode 101, a second electrode 102 and an active material 103 sandwiched between the first electrode 101 and the second electrode 102. The memory device 400 further includes a switching element 401 having a first input/output terminal 402, a second input/output terminal 403, a gate terminal 404 and a bulk terminal 405. The first input/output terminal 402 is electrically connected to the second electrode 102 of the resistive memory cell, and the second input/output terminal 403 is electrically connected to a bitline 406. The switching element 401 is controlled by the gate terminal 404 being electrically connected a wordline (not shown). The bitline 406 is electrically connected to a sense amplifier 409 having a digital output terminal 407 and a controlling terminal 408. The sense amplifier 409 may include only voltage amplifying functionality (voltage amplifier) or also further functionality (for example, latch functionality, sampling functionality, signal comparing functionality, etc.).

The memory device 400 may determine the memory cell's state as follows. The bitline is set to a voltage (preloading process) being smaller (or higher, see below) than the voltage of the first electrode 101, in this example 1.3 V. During the preloading process, the voltage of the gate terminal 404 is set to a value effecting that the switching element 401 is closed, i.e., the bitline 406 is electrically disconnected from the resistive memory cell 100. The voltage of the first electrode 102 is set to (or remains at) a constant voltage, in this example 1.5 V. Then, the gate terminal 404 is set to a voltage effecting that the switching element 401 opens, i.e., the resistive memory cell 100 is electrically connected to the bitline 406. At the same time or before, the bitline 406 is electrically disconnected from a preloading unit (not shown) responsible for the preloading process. Since the voltage of the first electrode 101 is kept at a constant value, the voltage of the bitline 406 is adapted to the voltage of the first electrode 101. The adaptation of the voltage of the bitline 406 to the voltage of the first electrode 101 results from the fact that the voltage difference between the first electrode 101 and the second electrode 102 charges a read capacity within the resistive memory cell 100, which is then discharged via the active material 103 of the resistive memory cell 100. The voltage adaptation process is detected and amplified by the sense amplifier 409. Alternatively, the voltage of the second electrode 102 may be set to a higher voltage value than that of the first electrode (preloading process). In this case, within the voltage adaptation process, not a discharging process, but a charging process of the read capacity will be carried out.

Figure 5:
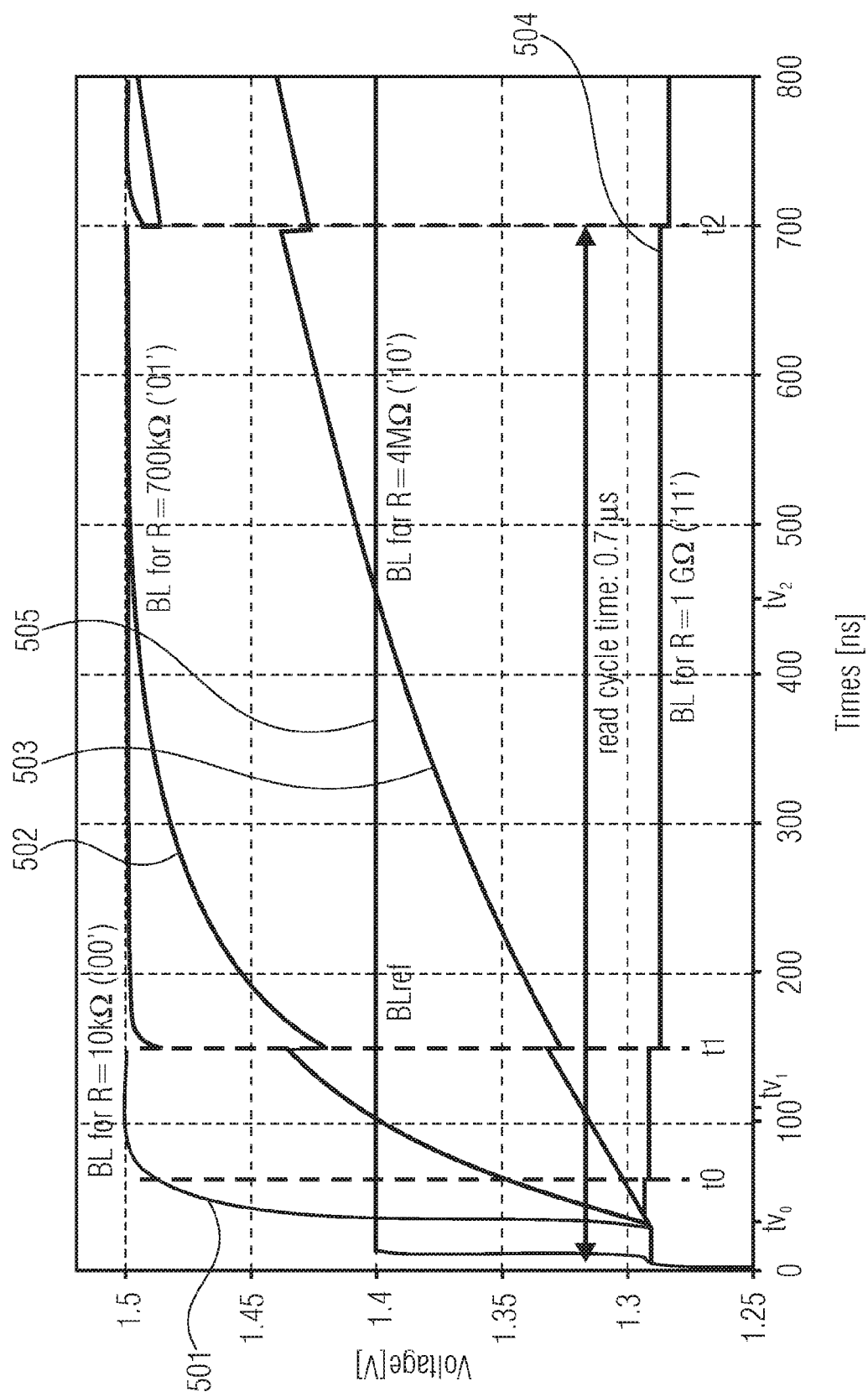
FIG. 5 shows a voltage diagram illustrating different read capacity discharging processes occurring in FIG. 2 in case of a 4-level memory cell.

As shown in FIG. 5, the adaptation of the voltage of the bitline 406 to the voltage of the first electrode 101 varies in dependence on the resistance of the active material 103 of the resistive memory cell 100. Assuming a constant capacity for each discharging process and assuming that, at the beginning of each discharging process, the voltage at the first electrode 101 is 1.5 V, and the voltage at the second electrode 102 is about 1.3 V, a first voltage adapting function 501 (resistance=10 k$\Omega$), a second voltage adapting function 502 (resistance=700 k$\Omega$), a third voltage adapting function 503 (4 M$\Omega$), and a fourth voltage adapting function 504 (resistance=10 G$\Omega$) are obtained. Thus, it is possible to determine the memory state of the resistive memory cell 100 as soon as the corresponding voltage adapting function is known.

In particular, it may be seen in FIG. 5 that each voltage adaptation function is strictly monotonously increasing (or strictly monotonously decreasing in case of a charging process). A reference voltage 505 is set to lie between the voltage with which the second electrode 102 is preloaded and the voltage applied to the first electrode 101 and is assumed to be 1.4 V in FIG. 5 for illustrative purposes. Accordingly, each voltage adaptation function intersects the reference voltage 505 merely once. For example, the voltage adaptation functions 501, 502 and 503 intersect the reference voltage at times $tv_0$, $tv_1$, and $tv_2$. In case of voltage adaptation function 504, the adaptation time duration is too long to be visible in FIG. 5. In fact, the memory cell resistance in case of the voltage adaptation function 504 may be selected such that the adapted state is effectively never reached during operation of the memory device. As may be further seen in FIG. 5, the steepness of the voltage adaptation function monotonously increases with decreasing memory cell resistance. This, in turn, means that voltage adaptation function corresponding to a lower memory cell resistance intersects the reference voltage earlier than voltage adaptation functions corresponding to higher memory cell resistances. Further, from the time instant on that that the voltage adaptation function has intersected the reference voltage, the relationship between the voltage adaptation function and the reference voltage keeps maintained, i.e., the voltage adaptation function maintains to be higher than the reference voltage in case of discharge.

Taking this into account, it is possible to discriminate between the voltage adaptation functions 501-504 of the n-level memory cell with n=4, by sampling and comparing the voltage of the voltage adaptation function 501-504 at three points in time $t_0$, $t_1$, and $t_2$ with the reference voltage, with these points in time separating the intersection times $tv_0$, $tv_1$, and $tv_2$, respectively.

To be more precise, not each sampling time is equally suitable in order to distinguish between different voltage adapting functions. For example, it is easier to distinguish between the second voltage adapting function 502 and the third voltage adapting function 503 at a second sampling time $t_2$ than at a first sampling time $t_1$ or at a third sampling time $t_3$. Therefore, the sampling times to discriminate between the first to fourth voltage adapting functions 501 to 504 may be selected such that the "variable" voltage, the second electrode represented by one of the first to fourth voltage adapting functions 501 to 504, and the reference voltage 505 is larger than a predetermined voltage threshold value.

Accordingly, three sampling times are assigned in the example shown in FIG. 5 (defining four possible resistance values of the resistive memory cell), namely the first sampling time $t_1$, the second sampling time $t_2$ and the third sampling $t_3$. The first sampling time $t_1$ is suitable in order to distinguish the first voltage adapting function 501 from the second to fourth voltage adapting functions 502 to 504. The second sampling time $t_2$ is suitable in order to distinguish the first and the second voltage adapting functions 501, 502 from the third and fourth voltage adapting functions 503, 504. The third sampling time $t_3$ is suitable in order to distinguish the first to third voltage adapting functions 501 to 503 from the fourth voltage adapting function 504. In this way, it is possible to uniquely identify each of the first to fourth voltage adapting functions 501 to 504 by sampling it at the sampling times $t_1$ to $t_3$, and therefore the memory state of the resistive memory cell.

After having described and illustrated the possibility of determining the memory state of an n-level resistive memory cell based upon a change of a voltage during the charge or discharge of the read capacity of the memory cell, embodiments of the present invention are described in the following with respect to the following figures.

Figure 6:
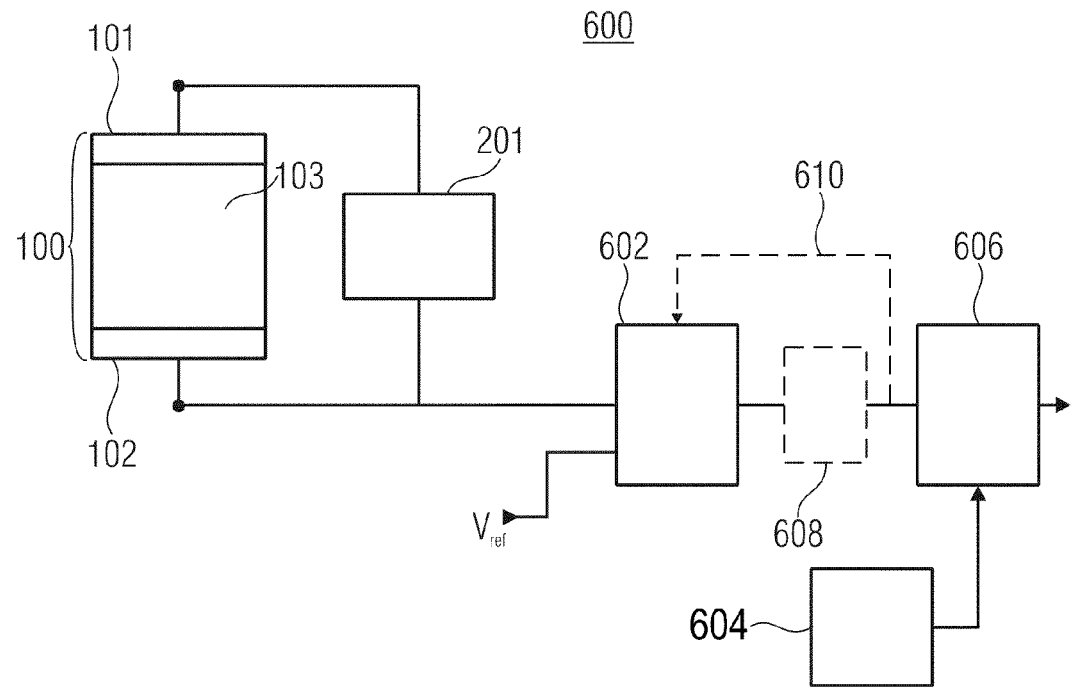
FIG. 6 shows a block diagram of a memory device according to an embodiment.

In particular, FIG. 6 shows a memory device 600 comprising a resistive n-level memory cell 100 including a first electrode 101, a second electrode 102 and an active material 103, being arranged between the first electrode 101 and the second electrode 102 and a voltage supplying unit 201 for generating a voltage between the first electrode 101 and the second electrode 102, as well as a sense amplifier 602. A voltage supplying unit 201 is configured to generate a voltage between the first electrode 101 and the second electrode 102. The sense amplifier 602 has an input connected to the second electrode 102. Further, the sense amplifier 602 comprises a reference input to which a reference voltage $V_{ref}$ is applied. The sense amplifier 602 may include only voltage amplifying functionalities such as a voltage amplifier or also further functionality, such as latch functionality, sampling functionality, signal comparing functionality, and the like. In particular, the sense amplifier 602 operates to compare the voltage at its first input with the voltage $V_{ref}$ so as to output a first comparison value or a second comparison value depending on the voltage at the first input (at the second electrode 102) being higher than the reference voltage $V_{if}$ or lower than the reference voltage $V_{if}$.

Further, the memory device 600 of FIG. 6 comprises a triggering circuit 604 and an evaluation circuit 606. The evaluation circuit 606 has an input being coupled to the output of the sense amplifier 602. The coupling may comprise a direct connection between both the sense amplifier 602 and the evaluation circuit 606. However, as indicated by the dashed lines in FIG. 6, the coupling between the sense amplifier 602 and the evaluation circuit 606 may also comprise an indirect connection between both entities via a latch 608. The latch enables maintaining the signal at the input of the evaluation circuit 606 in its current binary logical value, after the voltage adapting function has passed the voltage reference, so that this binary logical value is maintained even when the operation of the sense amplifier 602 is prohibited thereupon, as it is optionally the case in accordance with subsequently described embodiments and illustrated in FIG. 6 by means of dotted arrow 610.

The evaluation circuit 606 is controlled by a timing signal output by timing circuit 604, the timing signal defining the sequence of at least n−1 time instants during the charge or discharge of the read capacity of the memory cell 100, wherein, as already discussed above, it is assumed in the following that these time instants are $t_0$, $t_1$, and $t_2$, or time instants slightly deferred in time in order to address time delays occurring between the signal processing between the memory cell 100 and the input of the evaluation circuit.

Figure 7:
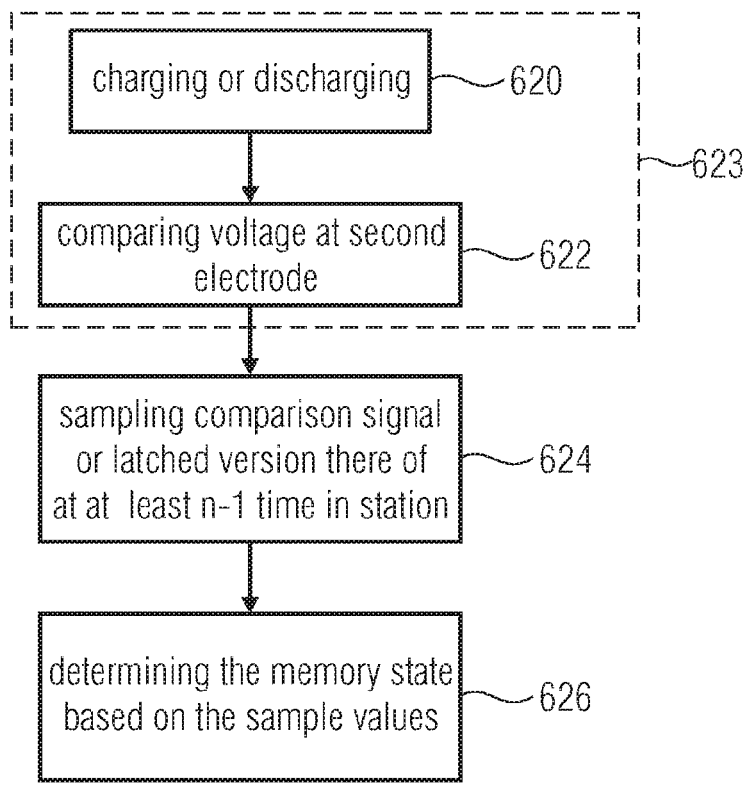
FIG. 7 shows a flow chart illustrating the mode of operation of the memory device of FIG. 6 according to an embodiment.

FIG. 7 shows a flow diagram depicting steps occurring during the operation of the memory device 600 of FIG. 6 when determining the memory state of the n-level resistive memory cell 100.

In step 620, the voltage supply unit 201 generates a voltage between the first electrode 101 and the second electrode 102 of memory cell 100, thereby initiating a discharge of the read capacity of the memory cell 100 as described above with respect to FIGS. 1-5.

In step 622, the sense amplifier 602 compares the voltage at the second electrode 102 with the reference voltage $V_{ref}$ during the charge or discharge of the read capacity. It is noted that the operation of the sense amplifier 602 may be continuous. However, as described further below, it is also possible that the sense amplifier 602 restricts its comparison operations to the time instants $t_0, \ldots, t_{n-2}$.

Since steps 620 and 622 take place concurrently, they may be interpreted as one step as illustrated by dotted line 623.

As shown in step 624, the evaluation circuit 606 samples the comparison signal as output by the sense amplifier 602, or the latched version thereof, as obtained at the output of latch 608 at the time instants $t_0, \ldots, t_{n-2}$, wherein the evaluation circuit 606 determines the memory state of the memory cell 100 based on these sample values in step 626. The time instants are indicated by the triggering circuit 604.

Although detailed embodiments for the structure of FIG. 6 and the operations shown in FIG. 7 are described in more detail below, the operation of the memory device of FIG. 6 in connection with the determination of the memory state shall be described shortly in more detail now. As described, the memory cell 100 is capable of storing a multi-level value such as several bits. The various states of the cell 100 differ in the resistance of the cell 100. As described with respect to FIG. 5, it is possible to discriminate between the n memory states by means of the sense amplifier 602 acting as a voltage amplifier performing a voltage comparison between the voltage at electrode 102 and the reference voltage $V_{ref}$ at n−1 time instants $t_0, \ldots, t_{n-2}$. Due to the use of a voltage amplifying sense amplifier 602, the layout area needed for the sense amplifier 602 is moderate compared to a current sensing amplifying unit. Further, due to the fact that only one sense amplifier 602 is needed to perform the steps of FIG. 7, a most compact placement of an array of memory cells 100 may be achieved, thereby alleviating the area consumption. In particular, in cases where several memory cells 100 are coupled to a common bitline associated with a respective sense amplifier 602, it is possible to arrange such bitlines in a minimum distance merely defined by the design constraints of the memory cells 100.

Using the sample values obtained at the time instants indicated by triggering circuit 604, the evaluation circuit 606 determines the memory state of the memory cell. The way the evaluation unit 606 performs this determination will readily be understood by the following detailed embodiments described with respect to FIG. 10 and the subsequent figures.

As far as the abovementioned optional provision of latch 608 is concerned, same renders sampling and comparing operations of the sense amplifier 602 superfluous at time instants following the time instant at which the voltage adaptation function exceeds the reference voltage and the latch 608, in turn, latches the comparison value output by the sense amplifier 602 when exceeded. By this measure, power consumption may be reduced which otherwise would be required by the sense amplifier 602 for performing its operation after the voltage adaptation function exceeding the reference voltage.

The combination of the provision of latch 608 on the one hand, and the prohibition signaling 610 on the other hand, further enables the evaluation circuit 606 to operate the same, independent of the actual memory state of the memory cell 100 and accordingly, independent from the first time instant $t_1$ in time at which the voltage adaptation function exceeds the reference voltage. However, the power consumption savings just-mentioned, are also possible, without the provision of latch 608. This will be described in more detail below with respect to FIGS. 8 and 9 showing a further embodiment for a memory device.

Figure 8:
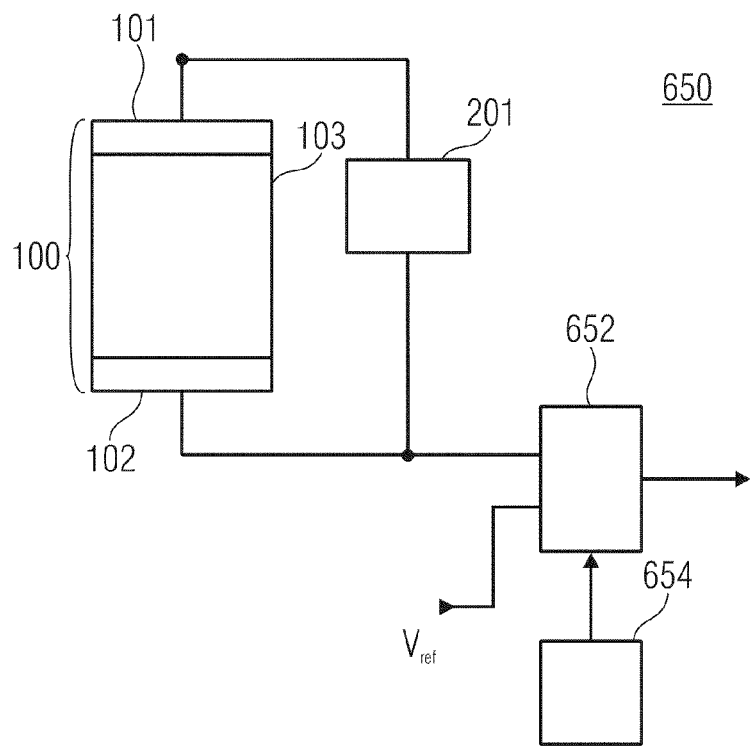
FIG. 8 shows a block diagram of a memory device according to a further embodiment.

FIG. 8 shows a memory device 650 comprising a resistive n-level memory cell 100 and a voltage supply unit 201 complying with those shown in FIG. 6 in terms of functionality and inter-operability. The memory device 650 of FIG. 8 further comprises a voltage comparison and determination circuit 652, as well as a triggering circuit 654. The voltage amplification and evaluation circuit 652 comprises an input being connectable to the second electrode 102, a reference input to which the reference voltage $V_{ref}$ is applied, as well as an output at which the circuit 652 outputs the determined memory state of the memory cell 100. The voltage amplification and evaluation circuit 652 is controlled by the triggering circuit 654 in a way illustrated in more detail below with respect to FIG. 9. In particular, as will be shown with respect to FIG. 9, in the steps involved in the operation of the memory device 650, the voltage amplification and evaluation circuit 652 internally comprises a capability of the sense amplifier 602 of FIG. 6. However, according to FIG. 8, the separation between the sense amplifier on the one hand and the evaluation circuit on the other hand is partially set aside within the voltage amplification and evaluation circuit 652 acting as described in the following with respect to FIG. 9.

Figure 9:
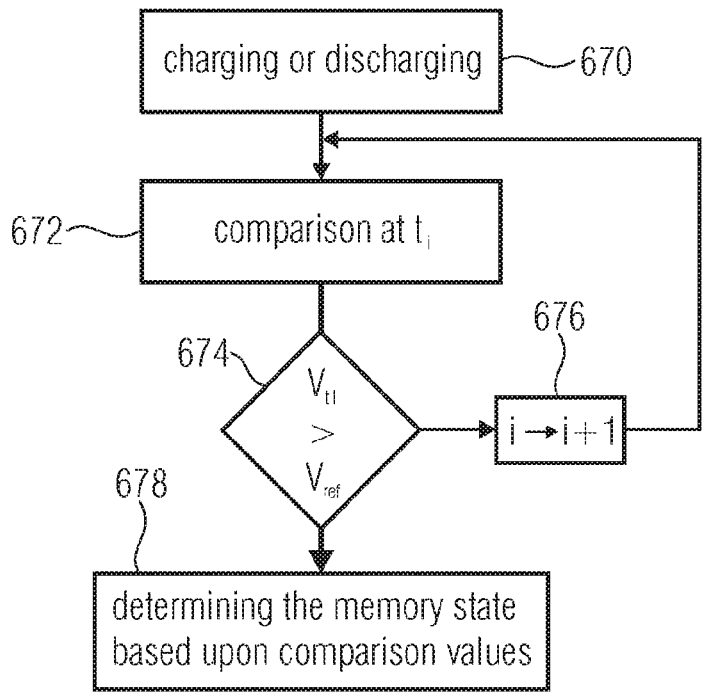
FIG. 9 shows a flow chart illustrating the mode of operation of the memory device of FIG. 8 according to an embodiment.

FIG. 9 shows the mode of operation of the memory device of FIG. 8 in determining the memory state of the memory cell 100 according to an embodiment. As shown in FIG. 9, the determination process starts at step 670 with discharging (or alternatively charging) the resistive n-level memory cell 100 via the voltage supply unit 201. Thereupon, a discharge process takes place resulting in the voltage at the second electrode 102 changing according to the voltage adaptation function associated with the memory state into which the memory cell 100 is actually set.

Then, at time instant $t_i$ as provided by the triggering circuit 654, the voltage amplification and evaluation circuit 652 compares the voltage present at its input with the reference voltage $V_{ref}$. The first time, step 672 is performed upon step 670, the time instant $t_i$ corresponds to the first time instant to. Thus, at this time the voltage at the second electrode 102 exceeds the voltage reference $V_{ref}$ only in case of the memory cell 100 being in the lower resistivity state. Otherwise, at time instant to, the comparison will result in the other comparison value indicating that the reference voltage $V_{ref}$ is higher than the voltage at the second electrode 102. After the first performance of step 672, the determination of the memory state takes place as described now.

Depending on the comparison result of step 672 and with the dependency indicated with 674, the voltage amplification and evaluation circuit 652 either keeps on comparing the voltage of the second electrode 102 with the reference voltage $V_{ref}$ at the subsequent time instants as indicated at step 676, or further comparisons at the remaining time instants until time instant $t_{n-2}$ are prohibited. In any case, at step 678, the memory state is determined based upon the comparison values obtained within the loops 672, 674 and 676.

It is noted that the flow chart of FIG. 9 merely serves for illustrative purposes and is not dedicated for restricting the mode of operation of the memory device of FIG. 8 to any timing order. To be more precise, the determination step 678 may in fact be seen as being processed in parallel to steps 672 to 676. For example, the determination step 678 could involve a determination of the memory state based upon a counter value of i as indicated in FIG. 9 with i being incremented between the iterative executions of the comparisons in step 672.

Figure 10:
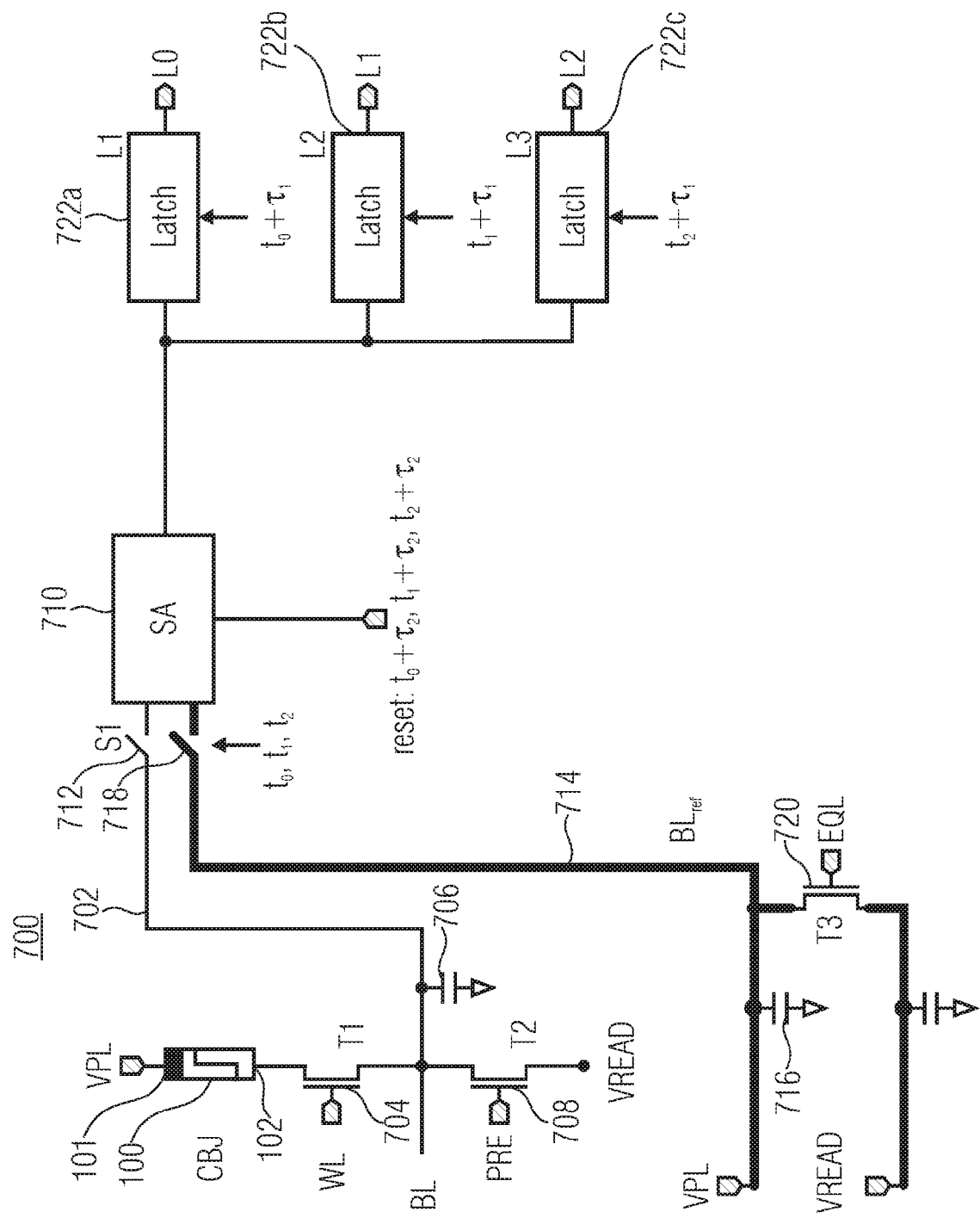
FIG. 10 shows a schematic drawing of a further embodiment.

After having rather broadly described memory devices with respect to FIGS. 6-9, FIG. 10 shows a memory device according to an embodiment in more detail. In FIG. 10, the memory device is indicated at 700. The memory device 700 is assumed to comprise a field or array of resistors n-level memory cells 100. While in FIG. 10 only one memory cell 100 is illustrated for the sake of a simpler understanding, resistive memory cells 100 arranged in a common line are connectable to a common bitline 702 via respective transistors 704. The bitline 702 shows a capacity 706 relative to a reference potential such as ground. Further, the bitline 702 is connectable to a read voltage $V_{read}$ via a transistor 708. Further, the bitline 702 is connectable to a first input of a sense amplifier 710 via a first switch 712.

A reference bitline 714 that may show a similar capacity 716 relative to ground by means for example, a similar routing or even parallel routing to bitline 702 is connectable to a second input of sense amplifier 710 via a second switch 718. The reference bitline is maintained at a reference voltage $V_{ref}$ lying between a voltage VPL being applied to the electrode 101 of the resistive memory cell 100 facing away from bitline 702 on the one hand and the read voltage $V_{read}$ on the other hand. As is shown in FIG. 10 the voltage $V_{ref}$ applied to reference bitline 714 may be generated by connecting the supply voltage VPL to the read voltage $V_{read}$ via a transistor 720.

Further, the sense amplifier 710 comprises an output to which the inputs of n−1 latches—in FIG. 10, exemplarily three latches 722a, 722b, and 722c—are connected. At the output of latch 722a, the latched value $L_0$ results. In a similar manner at the output of latch 722b the latched signal $L_1$ and at the output of latch 722c, the latch signal $L_2$ results.

The switches 712 and 718, the sense amplifier 710 and the latches 722a to 722c are controlled by a timing signal indicating the time instants $t_0$, $t_1$, and $t_2$. In particular, both switches 712 and 718 are controlled so as to be in an on state at the time instants $t_0$, $t_1$, and $t_2$. The latches 722a to 722c each receive a part of the timing signal indicating a different one of the time instants deferred by a time delay $\tau_1$, which will be discussed later. Thus, latch 722a has an enable input by which latch 722a is controlled such that latch 722a latches the output signal at the output of sense amplifier 710 at time instant $t_0+\tau_1$, wherein $\tau_1 \ll t_1-t_0$, and $\tau_1 \ll t_2-t_1$. Similarly, latch 722b has a sample input by which same is controlled such that same samples the output of the sense amplifier 710 at time instant $t_1+\tau_1$, and latch 722c has a sample input by which latch 722c is controlled to sample the output signal of the sense amplifier 710 at time instant $t_2+\tau_1$.

The sense amplifier 710, in turn, comprises a reset input to which reset impulses are input at time instants $t_0+\tau_2$, $t_1+\tau_2$, $t_2+\tau_2$, with $\tau_2$ being slightly greater than $\tau_1$, and wherein $\tau_2 \ll t_1-t_0$, and $\tau_2 \ll t_2-t_1$. For illustrative purposes only, it is noted that $\tau_{1,2}$ may be selected such that $\tau_{1,2} < (t_1-t_0)/10$, and $\tau_{1,2} < (t_2-t_1)/10$.

The transistor 720 is controlled by a signal EQL, whereas transistors 704 and 708 act as switching elements and are controlled by a word line signal WL provided via a word line on the one hand, and a pre-charge signal PRE on the other hand. The signals WL and PRE may be provided by a controller of memory device 700 not shown in FIG. 10 for sake of an easier understanding of the main issues of the memory device.

As becomes clear from the above, the memory device 700 of FIG. 10 is similar to the arrangement shown in FIG. 2 as far as the part of FIG. 10 between the memory cell 100 and the sense amplifier 710 is concerned. The same is true for FIG. 4. Thus, the discussion presented above with respect to FIGS. 1-5 is also transferable to this part of FIG. 10.

In reading the resistive memory cell 100, memory device 700 operates as follows. However, before describing the mode of operation of memory device 700 in more detail, it is noted that FIG. 10 concerns a memory device for a CBRAM cell with four differing states or levels, although the principles of the memory device 700 is easily transferable to other resistive memory technologies such as PCRAM technology. Further, as already noted above, the restriction to four possible states merely serves illustrative purposes.

As shown in FIG. 10, the resistive memory cell 100 is connected to voltage VPL at its anode, whereas the cathode is connectable to a row select line or word line carrying the signal WL via a switch element which could be a transistor 704 as shown in FIG. 10 or a diode. Although not shown in FIG. 10, but as will become clear from FIG. 14, the bitline 702 may connected to many switch elements such as switch element 704, each of which is connected to a different row select line carrying an own word line signal WL. Within a pre-charge process controlled by signal PRE, the bitline 702 may be connected to the read voltage $V_{read}$ via transistor 208. This is done before reading with the transistor 208 being switched off again during reading.

The sense amplifier 710 may be a differential sense amplifier which is shortly disconnected from the bitline 702 and the reference bitline 714 via switches 712 and 718 at the aforementioned time instants $t_0$, $t_1$, and $t_2$. Switches 712 and 718 may be designed such that their switching times coincide. Before the actual reading takes place, the reference voltage $V_{ref}$ is applied to a reference line 714 with the reference voltage lying between the voltage VPL and $V_{read}$, such as, for example, in the middle of both voltages, as shown in FIG. 5. As shown in FIG. 10, the reference voltage $V_{ref}$ may be generated by connecting voltages VPL and $V_{read}$ via a switch, i.e., transistor 720. The actual reading procedure is then performed in the following way. Firstly, the bitline 702 is precharged onto read voltage $V_{read}$ by setting signal PRE high. After the voltage on bitline 702 having reached $V_{read}$, the signal PRE is set low again so that the voltage on the bitline 702 is temporarily maintained by the parasitic capacity 706 of bitline 702 only. Then, the word line signal WL on the row select line connected to the control input of transistor 704 is set to a logical high value, whereby transistor 704 is switched on and the bitline 702 is charged to voltage VPL via the resistance of resistive memory cell 100. Depending on the resistance of the resistive memory cell which, in turn, is dependent on the logical value of the level stored in the memory cell 100, the charge of the resistive memory cell 100 is fast, less fast, slow.

In other words, as has been described with respect to FIG. 5, the voltage at bitline 702 follows an exponential charge curve starting from voltage $V_{read}$ and heading to voltage VPL. The prescribed time instants $t_0$, $t_1$, and $t_2$ are selected such that the four possible states of the resistive memory cell 100 may be discriminated based on the values provided by voltage amplifying sense amplifier 710. If the voltage of the bitline 702 is still beneath the reference voltage $V_{ref}$ being present on the reference bitline 714 at a current of one of the predetermined time instants $t_0$, $t_1$, and $t_2$, then the signal output by sense amplifier 710 is, for example, a logical 0. In the other case, i.e., if the voltage at bitline 702 is higher than the reference voltage, the sense amplifier output signal changes to assume, for example, a logical 1. As described above with respect to the previous figures, the sense amplifier is configured such that its output signal is binary. In other words, the comparison signal output by sense amplifier 710 either assumes a logical 0, or a logical 1.

Again, the predetermined time instants in the following referred to as evaluation times, $t_0$, $t_1$, and $t_2$ are selected such that a recognition of the current state of the memory cell 100 based on the resulting comparison values obtained at these time instants exceeds a certain probability. In FIG. 10, $\tau_1$ is a time duration passing until the sense amplifier 710 is able to provide a stable result of the comparison between the voltage at bitline 702 with the reference voltage $V_{ref}$ on reference bitline 714. At the time instants $t_0+\tau_1$, $t_1+\tau_1$, and $t_2+\tau_1$, the output signal of the sense amplifier 710 is stored in the latches or sample stages 722a, 722b, and 722c, respectively. After a time interval $\tau_2$, the sense amplifier 710 is again reset in order to be able to compare the current voltage at bitline 702 which is changed in the meantime, with the reference voltage $V_{ref}$ at the next one of the evaluation times $t_0$, $t_1$, and $t_2$. By using the values stored within latches 722a, 722b and 722c, the state of the memory cell 100 may be derived and thus, the logical bits stored therein.

Due to the fact that according to the embodiment of FIG. 10, n=4 possible states are discriminated within memory cell 100, memory cell 100 is able to store m bits with n=$2^m$. A logical unit or a look-up table circuit connected to the outputs of latches 722a to 722c derives the logical bits bit0 and bit1 with bit 1 being, for example, the most significant bit, by performing a logical operation or a look-up in accordance with the following table.

| L0 | L1 | L2 | Resistance | most significant bit | Secondary significant bit |
|----|----|----|------------|---------------------|--------------------------|
| 1  | 1  | 1  | 10 kΩ      | 0                   | 0                        |
| 0  | 1  | 1  | 700 kΩ     | 0                   | 1                        |
| 0  | 0  | 1  | 4 MΩ       | 1                   | 0                        |
| 0  | 0  | 0  | 1 GΩ       | 1                   | 1                        |

The memory device 700 of FIG. 10 has been simulated. The simulation result is shown in FIG. 5. FIG. 5 illustrates the course of the voltage at bitline 702 in case of the three lowest resistive states. The remaining state, in which within the resistive memory cell 100 almost no connection exists, is not shown in its entirety since no charge curve is visible at reasonable time intervals. However, it is again noted that the reference values used in the simulation of FIG. 5 merely serve as an example and their values may be varied in another embodiment. In FIG. 5, the evaluation times or predetermined time instants $t_0$, $t_1$, and $t_2$ are also shown.

Thus, in accordance with FIG. 10, three or n−1 latches have been used in order to sample the output of sense amplifier 710. The latches 722a, 722b, and 722c may be sample and hold registers. However, it is also possible that these latches are implemented as back-coupled inverter latches having two inverters coupled in parallel but in reverse direction, with a transmission gate serially connected to the input of each respective latch and being controlled by the timing signal input at the respective sample input of the respective latch.

Further, the sense amplifier 710 has been described to have a latch functionality in that the sense amplifier has been disconnected multiple times from the bitline 702 with the sense amplifier comparing the voltage on bitline 702 with the reference voltage before each disconnection, temporarily storing the comparison result in an internal latch of the sense amplifier, storing the comparison result into one of the latches 722a-722c and resetting the sense amplifier 710 along with the internal latch for the next comparison process for which the bitline 702 has to be connected to the sense amplifier 710 again at the next evaluation time and so on. However, it is noted that the reset input of the sense amplifier 710 and the internal latch functionality is optional. The sense amplifier 710 may, as has been described above, may be implemented in many ways. The sense amplifier 710 may, for example, be implemented in such a way that a resetting of the sense amplifier 710 in order to perform the next comparison is not necessary. Rather, the sense amplifier 710 may be designed such that same is able to continuously compare the voltages on lines 702 and 714 without compromising or affecting the voltage adaptation curve present on the bitline 702 due to the resistance state present in memory cell 100. In this case, even the transistors 712 and 718 may be left away. Rather, in this case, the sampling of the voltage on the bitline 702 during the charge/discharge procedure several times could be performed by means of the triggering of latches 722a to 722c via the respective sample inputs thereof. In the example of FIG. 10, multiple sampling is performed by means of the switches 712 and 718 disconnecting the bitline 702 from the sense amplifier 710 which are closed and opened several times. At the output side of the sense amplifier 710, each comparison result is stored separately in one of the latches 722a-722c.

Summarizing FIG. 10, same shows a possibility to determine the state of a 4-level memory cell capable of storing four possible resistivity states. The memory device 700 has only one voltage read amplifier in the form of the sense amplifier 710 and thus is implementable without consuming much layout area.

Similar to FIG. 4, the memory device of FIG. 10 derives the stored value of the memory cell based on the resistivity of the cell and the corresponding voltage adaptation function. Depending on the resistivity of the memory cell, the voltage of the bitline 702 raises fast or less fast up to the value VPL. By comparing the voltage at bitline 702 at the three appropriate time instants with the voltage references $V_{ref}$, the two bits stored within the memory cell 100 are derived. In particular, in FIG. 10, shortly after each comparison time instant $t_0$, $t_1$, and $t_2$, one of the latches 722a-722c is closed, thereby latching or storing the current result of the comparison performed by the sense amplifier 710. After the n−1 or three amplification/comparison procedures at the time instants $t_0$, $t_1$, and $t_2$, some logic (not shown in FIG. 10 as mentioned above) determines the values of the bits stored within the memory cell 100 based on the latched values.

Figure 11:
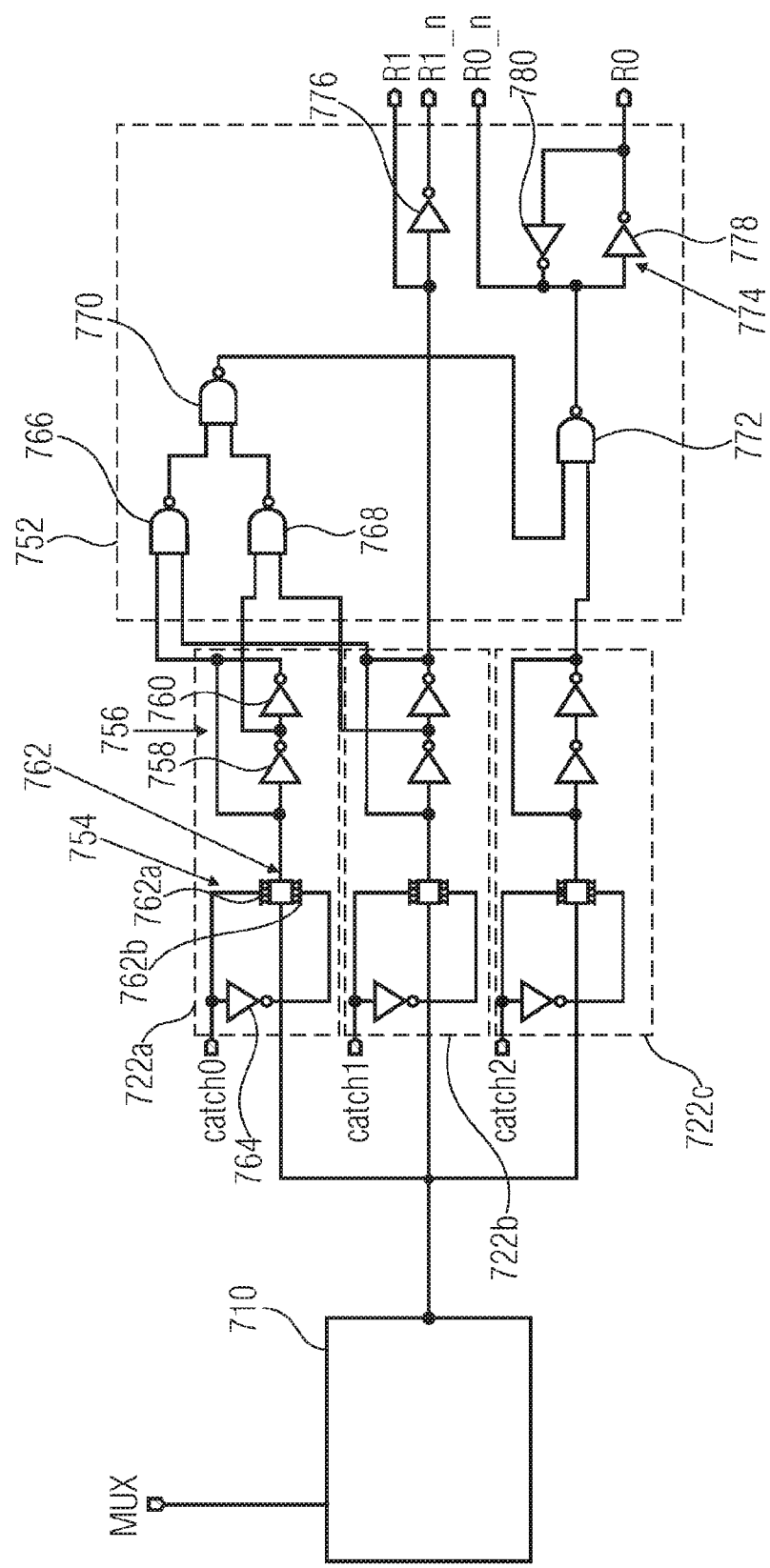
FIG. 11 shows a schematic diagram of a part of the memory device of FIG. 10 following the sense amplifier according to an embodiment.

FIG. 11 shows a part of a memory device in more detail in accordance with an embodiment which corresponds to the portion of the embodiment of FIG. 10 from the sense amplifier 710 to the latches, including the aforementioned, but not yet shown, logic following the latches. In particular, in the circuit part 750 shown in FIG. 11, the sense amplifier 710, including its reset input MUX as well as the latches 722a, 722b, and 722c are shown. Further, the circuit path 750 comprises a logic 752 for deriving the stored bit values R1 and R0 including their compliments R1_n and R0_n from the latched values within latches 722a and 722c.

As shown in FIG. 11, each latch comprises a series connection of a transmission gate circuit 754, and a feedback inverter latch 756 connected in the order mentioned between the sense amplifier 710 and logic 752.

Figure 12:
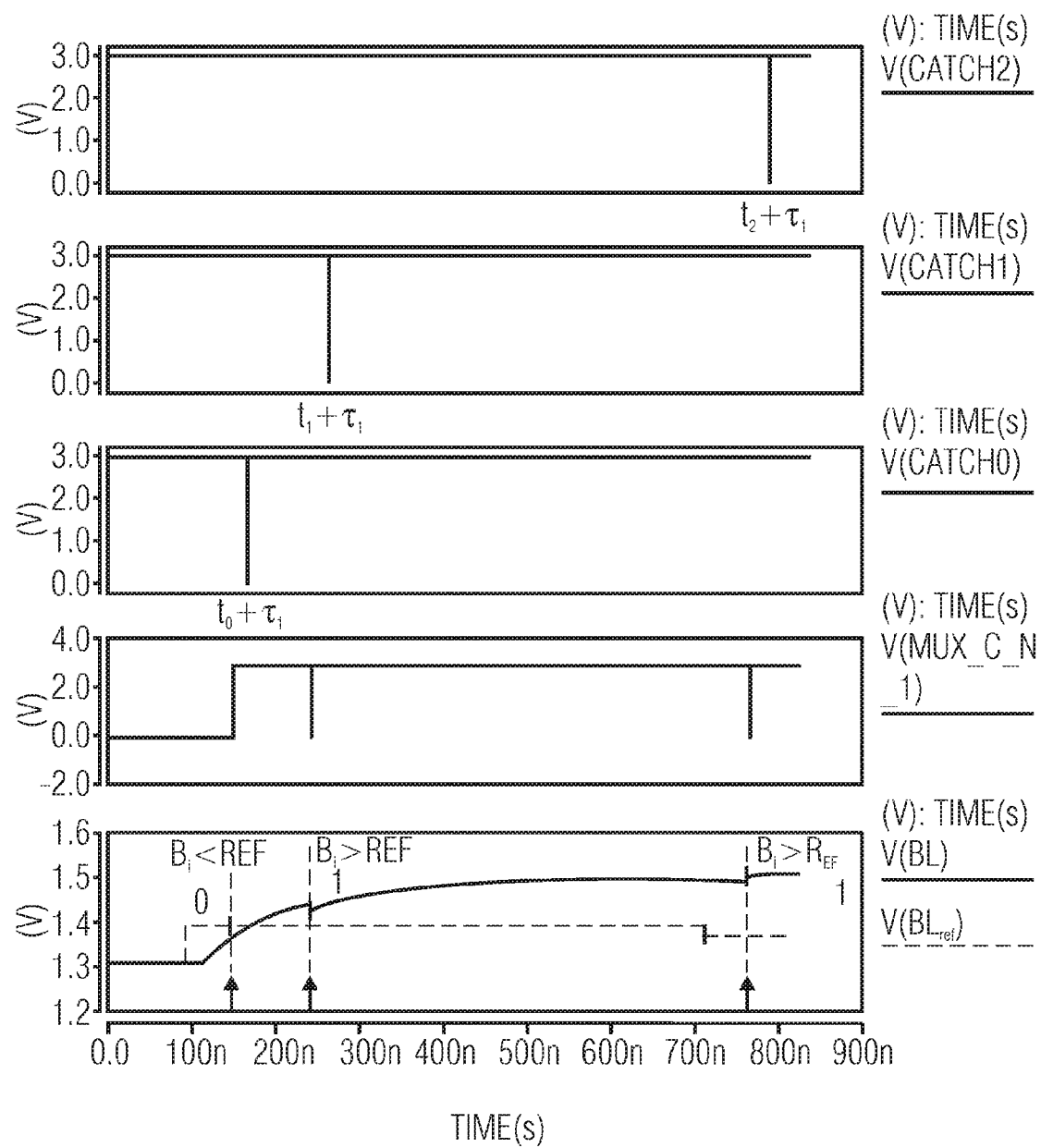
FIG. 12 shows voltage diagrams illustrating various signals occurring within the schematic diagram of FIG. 11 according to an embodiment.

The feedback inverter latches 756 comprise two inverters 758 and 760 connected in series between the output of sense amplifier 710 and logic 752, wherein the output of the inverter 760 positioned nearer to logic 752 is routed back via a feedback path to the input of the other inverter 758. The transmission circuit 754 comprises a transmission gate 762 coupled between the input of inverter 758 and the output of sense amplifier 710. The transmission gate 762 comprises two transistors 762a and 762b coupled in parallel and having an opposite conductivity type. For example, transistor 762b may be an NMOS transistor, while transistor 762a may be a PMOS transistor. Control terminal or gate of transistor 762a is connected to a respective sample input of the respective latch 722a to 722c, while the control terminal or gate of the other transistor 762b is connected to same input via an inverter 764. Each of the latches 722a to 722c receives an individual differing trigger signal catch0, catch1, and catch2, respectively, at its sample input. Examples for these signals are depicted in FIG. 12. As shown therein, the signals assume a logical 1, except at one time instant, namely time instant $t_0+\tau_1$ in case of latch 722a, $t_1+\tau_1$ in case of latch 722b and $t_2+\tau_1$ in case of latch 722c.

The evaluation circuit 752 comprises four NAND gates 766, 768, 770 and 772, as well as a feedback inverter latch 774 and an inverter 776. Besides this, logic 752 comprises an output R1 for the most significant bit, an output R0 for the least significant bit and respective outputs for the inverted signals R1_n and R0_n. As shown in FIG. 11, the feedback inverter latch 774 comprises two inverters 778 and 780, with the output of inverter 778 being connected to output R0 and inverter 780 being connected between the output and the input of inverter 778, with the input of inverter 780 being connected to output R0, and the output being connected to output R0_n. The inputs of NAND gate 766 and 768 are connected to respective circuit nodes within latches 722a and 722b, namely the output of inverter 760 and the output of inverter 758 of the feedback inverter latch 756 as it is shown in FIG. 11. Further, one of the two inputs of the NAND gate 772 is connected to the output of inverter 760 of feedback inverter latch 756 of latch 722c. The other input of NAND gate 772 is connected to an output of NAND gate 770, the inputs of which are connected to the respective output of NAND gate 766 and NAND gate 768, respectively. The output of NAND gate 772, in turn, is connected to output R0_n and the input of inverter 778, respectively.

In determining the stored bits R1 and R0 of the 4-level memory cell, the circuitry 750 of FIG. 11 operates as follows. The signals catch0, catch1, and catch2, are generated such that they assume the logical value of 1 shortly after the n–1, or three comparison processes of the sense amplifier 710 at the time instants $t_0$, $t_1$, and $t_2$. Thereby, the output signal of sense amplifier 710 is latched in the three latches 722a, 722b and 722c. As soon as the third comparison value or comparison result is latched in latch 722c, logic 752 determines the stored information bits R0 and R1, so that these information bits correspond to the latched values in the way indicated in the above table.

It is noted that the embodiment of FIG. 11 not only generates or determines the information bits R0 and R1, but also the respective inverted signals thereof. Of course, this is not necessary. However, if present, these inverted signals R1_n and R0_n may be used in a second amplification stage for a refreshing at the edge of the memory field comprising the respective memory cell with these amplification processes normally operating in a differential mode. Latch 774 is advantageous in that it enables the information bits R1 and R0 to be present at the respective outputs R1 and R0, at the same time.

In the bottom of FIG. 12, the voltage at the bitline 702 is exemplarily shown for a case in which the memory cell 100 has a resistance state of 700 kΩ. As has already been described with respect to FIG. 5, the voltage at the bitline 702 raises from $V_{read}$=1.3 V to VPL=1.5 V. the reference voltage $V_{ref}$ at reference bitline 714 is in between both voltages, i.e., at $V_{ref}$=1.4 V. Further, FIG. 12 shows an example for the signal MUX_c_n_1 that is applied to the input MUX of sense amplifier 710. Internally, the sense amplifier 710 may be configured such that during times where this signal is logically high, the sense amplifier 710 is connected to the bitline 702, whereas at times where this signal is logically low, the sense amplifier 710 is disconnected from the bitline. Insofar, the signal MUX_C_N_1 is a signal which connects the bitline to the sense amplifier 710 and initiates a comparison step. In the first comparison step at time instant $T_0+\tau_2$, the voltage at the bitline 702 V(BL) is lower than the voltage at the reference bitline 714 V(BL$_{ref}$). Thus, the first comparison value of the sense amplifier 710 is 0. At the second comparison step, V(BL) is greater than V(BL$_{ref}$). Thus, the second result of the sense amplifier 710 is 1. At the third comparison step, V(BL) is greater than V(BL$_{ref}$). Thus, the third comparison result output by sense amplifier 710 is 1. Thus, the signal catch0 results in a latch of the 0 in latch 722a, catch1 results in latching the first 1 in the second latch 722b, and catch 2 results in latching the second 1 in the third latch 722c. The logic 752 then derives the information bits R1 and R0 from the latched values in the way indicated in the above table.

Figure 13:
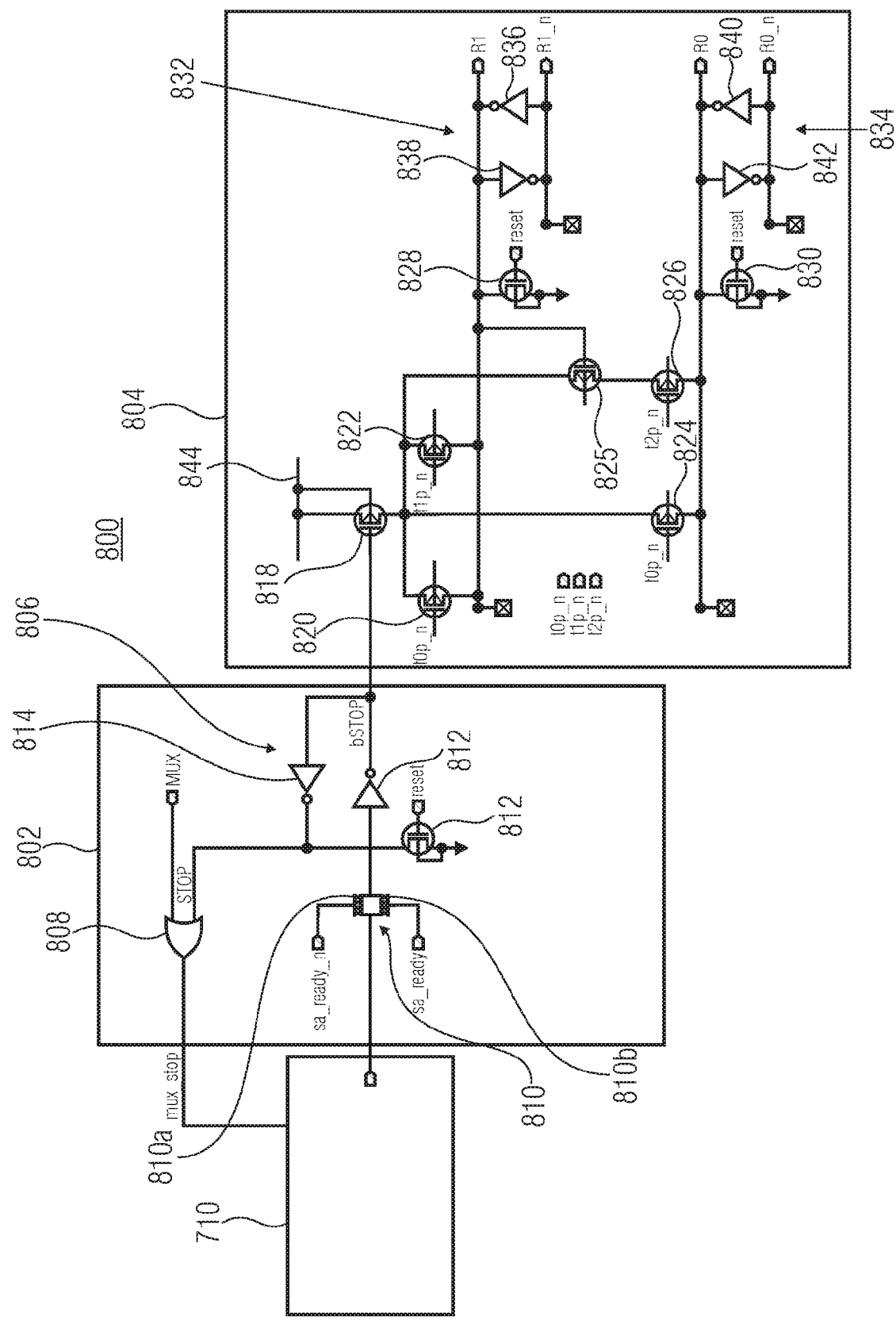
FIG. 13 shows a schematic diagram of a part of a memory device following the sense amplifier according to a further embodiment.

FIG. 13 shows another embodiment for the part of a memory device shown in FIG. 11, this part being indicated by 800. However, in case of FIG. 13, the circuitry 800 does not use the latches 722a to 722c shown in FIG. 10. Rather, the part 800 shown in FIG. 13 represents an embodiment for a memory device according to which the elements 710, 722a to 722c of FIG. 10 are replaced by the elements shown in FIG. 13, with the sense amplifier 710 being connected to the bit lines 702 and 714, respectively. Besides the sense amplifier 710, the circuitry 800 of FIG. 13 comprises a stop signal generation circuit 802 and an evaluation circuit 804.

The stop signal generating circuit 802 comprises a feedback inverter latch 806, a NOR gate 808, a transmission gate 810 and a reset switch or transistor 811. The transmission gate 810 comprises two transistors 810a and 810b, both transistors 810a and 810b being connected in parallel to each other and having opposite conductivity type. The control terminals or gates of these transistors 810a and 810b are controlled by a signal SA_ready or SA_ready_n, respectively, in order to enable a transmission via the transmission gate 810 in case of the signal SA_ready being 0.

The feedback inverter latch 806 comprises two inverters 813 and 814, with inverter 813 having an output connected to evaluation circuit 804 and an input connected to the output of sense amplifier 710 via transmission gate 810. The other inverter 814 has its input connected to the output of inverter 813, and has an output connected to the input of inverter 813. The output of inverter 814 is also connected to the output of sense amplifier 710 via transmission gate 810 and is connected to ground via reset switch or transistor 811, the control terminal or gate of which receives a signal reset. Further, the output of inverter 814 is also connected to an input of NOR gate 808. The other input of NOR gate 808 intercepts the signal applied to input MUX. The output of NOR gate 808 is connected to the reset input of sense amplifier 710.

The evaluation circuit 804 comprises eight transistors or switches 818, 820, 822, 824, 826, 828, and 830. Further, the evaluation circuit 800 comprises two feedback inverter latches 832 and 834. Besides this, the evaluation circuit has four outputs R1, R0, R1_n, and R0_n.

In particular, the inverters 836 and 838 of feedback inverter latch 832 are connected in opposite directions between output R1 and R1-n, while inverters 840 and 842 of feedback inverter latch 834 are connected in opposite directions between output R0 and R0_n. Both outputs R1 and R0 are connected to ground via a respective switch 828 and 830, the control terminals or gates of which receive the signal reset. Further, the output R1 is connected to a high supply voltage 844 via a first path and a second path, the first path comprising a series connection of transistors 818 and 820, while the other path comprises a series connection of transistors 818 and 822 between the high supply voltage 844 and output R1. Similarly, the output R0 is connectable to the high supply voltage 844 via one of two paths, one of which comprises a series connection of transistors 818 and 824, and the other one of which comprises a series connection of transistors 818, 825 and 826. Transistors or switches 820 and 824 receive a signal t0$p$_n at its control terminal or gate, while transistor or switch 822 receives at its control terminal or gate a signal t1$p$_n, and transistor or switch 826 receives at its control terminal or gate a signal t2$p$_n. The control terminal or gate of transistor or switch 825 is connected to the output R1 and the control terminal or gate of transistor 818 is connected to the output of inverter 813 of feedback inverter latch 806 of the stop signal generating circuit 802.

For sake of completeness only, it is noted that it is assumed with respect to FIG. 13 that transistors 811, 828 and 830, as well as 810 are, for example, NMOS transistors, while the other transistors are PMOS transistors. However, other configurations would also be possible with only minor adaptations to the signals applied thereto, or with the interconnection of the same.

The operation of the circuitry of FIG. 13 is as follows. The output signal output by sense amplifier 710 is passed further via the transmission gate 810 and input into latch 806. The signal SA_ready occurs shortly after the three time instants $t_0$, $t_1$, and $t_2$. As soon as this signal is 1, the following edges on the signal at input MUX are intercepted or suppressed by means of NOR gate 808 with a signal at MUX being dedicated for causing, inter alia, a connection of the bitline 702 with the sense amplifier 710. To this end, the signal SA_ready controls the transmission gate 810 behind which the feedback inverter latch 806 is arranged. The signal reset resets the signal stop occurring at the output of inverter 813, concurrently forming the output of stop signal generating circuit 802, by way of transistor 811 at the beginning of each memory state determination procedure to the logical value of 0. The NOR gate 808 NORs the signal at input MUX for disconnecting the sense amplifier 710 from the bitline 702 at the beginning of each comparison step at time instant $t_0$, $t_1$, and $t_2$, with the signal STOP present at the output of inverter 814. The result is a signal MUX_STOP at the output of NOR gate 808, which is now used to control the sense amplifier 710 instead of the signal at input MUX causing the sense amplifier 710 to disconnect itself from the bitline 702.

In other words, the STOP signal generating circuit 802 functions so as to latch the signal output by sense amplifier 710 and to prohibit further comparison steps performed by the sense amplifier 710 at the time instants $t_0$, $t_1$, and $t_2$ as soon as the comparison result in any of these time instants reveal that the voltage adaptation function has already passed the reference voltage. In this case, the feedback via NOR gate 808 results in a prohibition of further comparison steps being performed by the sense amplifier 710 in the following time instants.

As already noted above, the sense amplifier 710 may be designed such that the signal applied to its output connected to the output of NOR gate 808, results in a disconnection of the sense amplifier's input from the bitline 702. Due to this, the signal STOP prevents the bitline 702 is again connected with the sense amplifier 710 as soon as the sense amplifier 710 has sensed that the bitline voltage is higher than the reference voltage.

If, for example, the resistivity state of the memory cell 100 is 700 kΩ, the first comparison result is a 0, as can be seen from FIG. 5. However, the second comparison result reveals that the voltage of the bitline is higher than the voltage of the reference line. This, in turn, means that the bitline voltage has crossed the reference voltage. Due to this, the signal STOP is set to logical 1, and the signal MUX_STOP is set to 0 from that time on, whereby the bitline 702 and the sense amplifier 710 stay disconnected. The evaluation circuit 804 is designed to determine the information bits R1 and R0 from the signal STOP or bSTOP in a manner which may be fast and low area consuming. To this end, three signals are generated and applied to evaluation circuit 804, namely the signals t0p_n, t1p_n, and t2p_n. The signal curves of these signals correspond to those shown in FIG. 12 for the signal catch0, catch1, and catch2, respectively. Thus, the signal t0p_n has a short pulse from normally 1 to 0 occurring at time instant to, and the signal t1p_n has a short pulse at time instant $t_1$ and so on.

The functionality of the evaluation circuit 804 may readily be understood by referring to the above table showing the dependency of the three comparison results output by sense amplifier 710 and the information bits R0 and R1. Depending on which result the comparison of the bitline voltage and the reference voltage for the three time instants $t_0$, $t_1$, and $t_2$ is, the information content of the memory cell 100 may be determined accordingly. According to circuitry 800, comparisons are performed merely as long as no 1 has been output by sense amplifier 710. Compared to the logic 752 of FIG. 11, comprising a lot of NAND gates, the evaluation circuit 804 of FIG. 13 is relatively less complex.

In particular, a the three signals t0p n, t1p_n, and t2p n shortly assuming the 0 state at the three time instants $t_0$, $t_1$, and $t_2$, respectively, cause conductive paths to occur within evaluation circuit 804, which enable loading the signals R1 and R0 from its initial state 0 to a logical state 1. To this end, the signals R1 and R0 are set to 0 at the beginning of a read procedure, or memory state determination procedure, by means of transistors 828 and 830 and the signal reset, respectively.

For example, considering the case that a resistive cell has a resistance state of 700 kΩ, the signal STOP equals 1 from the second time instant $t_2$ on. Only from this time on, transistor 818 is switched on. Thus, although at time instant to the signal t0p_n had its pulse, the respective switching on of transistors 820 and 824 had no effect due to transistor 818 still being switched off. However, this is different at the time the signal t1p_n has its pulse from 1 to 0, since at this time transistor 818 is switched on. Due to this, the voltage at output R1 is pulled up to a logical 1. This logical 1 is latched in latch 832, thereby also generating the signal R1_n which is the inverted signal relative to R1.

As soon as R1 has got a logical 1, transistor 825 interrupts the path connecting output R0 to the highest supply voltage 844 via transistor 826 controlled by the signal t2p_n to be activated in the next time instant $t_2$. Therefore, the signal t2p_n is not able to pull up the signal at R0 to a logical 1 via transistor 826. This is only possible in the case of the 4MΩ case. In this case, however, signal STOP receives the 1 only after the signaled comparison step at time instant $t_3$, so that R1 is kept 0, what in turn enables pulling up the signal at output R0 to a logical 1 via transistor 825.

Having described the embodiments of FIGS. 11 and 13, it is noted that FIG. 13 shows an embodiment that is in agreement with both FIGS. 6 and 8, as previously described, and that the embodiment of FIG. 11 complies with FIG. 6. In particular, when comparing the embodiment of FIG. 13 with FIG. 6, latch 806 corresponds to latch 608, the signal STOP and MUX_STOP and the lines carrying the same correspond to prohibition path 610, evaluation circuit 804 corresponds to evaluation circuit 606 and the entity not shown in FIG. 13 (generating signals t0p n, t1p_n, and t2p_n) corresponds to the triggering circuit 604. When comparing the embodiment of FIG. 13 with FIG. 8, the whole circuitry 800 corresponds to element 652. Comparing the embodiment of FIG. 11 with FIG. 6, the latches 722a to 722c along with logic 752 correspond to the evaluation circuit 606 with FIG. 6 assuming the option without latch 608 and prohibition path 610.

The above description mostly relies upon the assumption that the memory cell is a 4-level memory cell having four resistivity states. In particular, the resistivity states were exemplarily given as 7 kΩ, 4 MΩ, 1 GΩ, and 10 kΩ. As noted above, these resistance values are merely illustrative. However, when writing information bits into the n-level memory cell mentioned above, the memory cell's resistance should be set in accordance with the information bits to the corresponding one of these resistance values. That is, in case of the above specific embodiment, a resistance value of 10 kΩ should be set in case of the information bits to be stored being "00", a resistance value of 7 kΩ should be set in case of the information bits to be stored being "01", and so on. In the following, embodiments for achieving such writing are described. However, as a precautionary measure only, it is noted that the embodiments presented above are not restricted to writable or rewritable memory cells. Rather, the above embodiments are also applicable to ROMs, in which case the below described embodiments for writing are superfluous.

Figure 14:
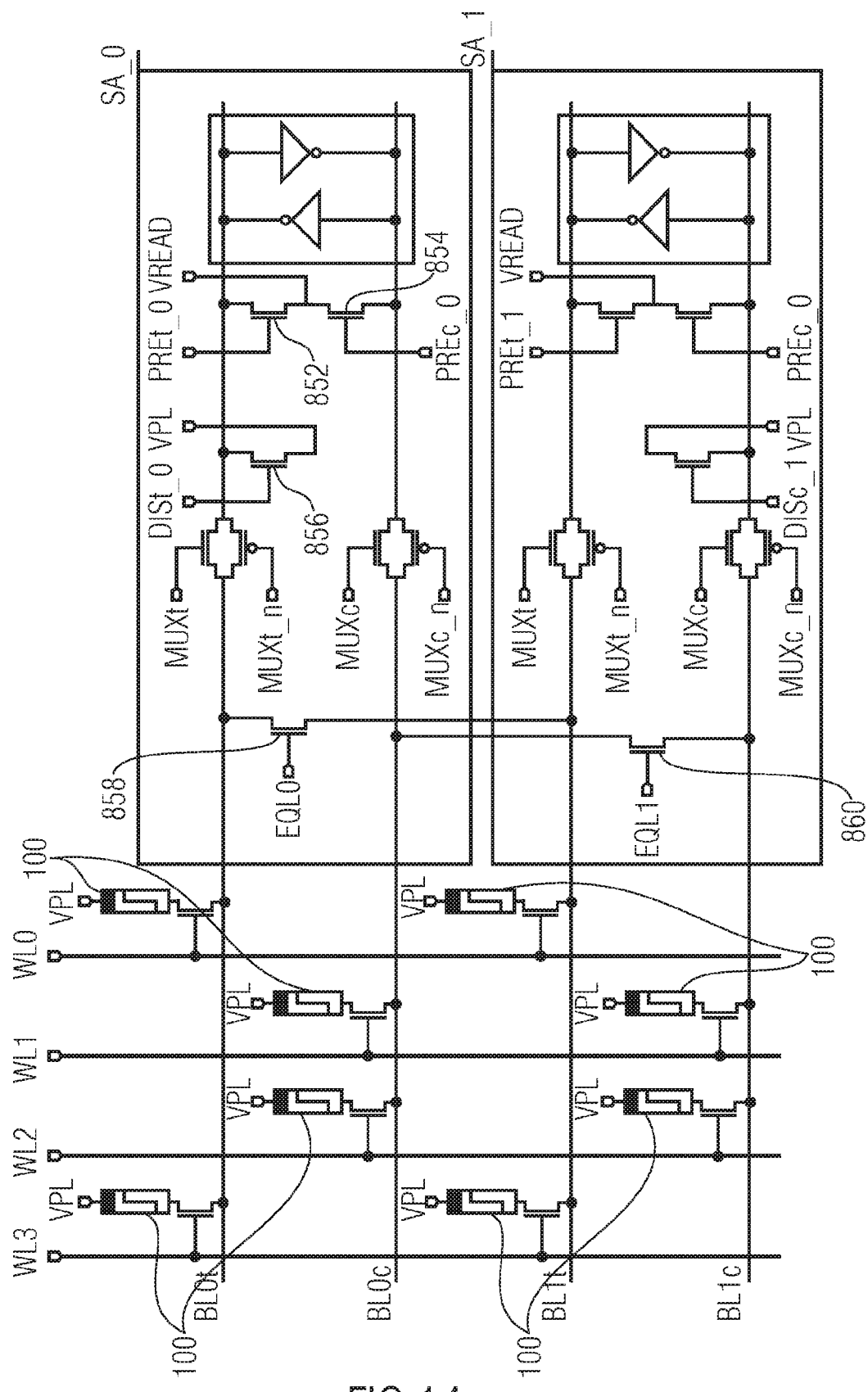
FIG. 14 shows a schematic diagram of an array of memory cells and corresponding sense amplifiers according to an embodiment.

However, before dealing with the issue of how to write to the memory cell, FIG. 14 shows an alternative charge balancing reference scheme. To be more specific, in the embodiment of FIG. 10, a signal EQL was used to create the reference voltage for the sense operation locally at the sense amplifier using neighboring reference bit lines. FIG. 14 shows an arrangement of memory cells in a field of memory cells in which the sense amplifiers are organized in pairs and a charge balancing reference scheme involves these pairs. In particular, FIG. 14 shows a section of a memory cell field, exemplarily comprising eight memory cells 100. Pairs of these memory cells 100 are connected to a common wordline of four wordlines WL0, WL1, WL2, and WL3. Similarly, pairs of these memory cells 100 are connected to a common bitline of four bitlines BL0t, BL0c, BL1t, and BL0c. Differing from the abovementioned embodiments according to which each sense amplifier was associated with one bitline and a respective associated reference bitline, according to the embodiment of FIG. 14, each pair of bitlines, namely BL0t and BL0c on the one hand and BL1t and BL1c on the other hand, is associated with a common sense amplifier SA0 and SA1, respectively.

For sake of pre-charging an active one of the two bitlines associated with one of the sense amplifiers SA0 and SA1, each sense amplifier comprises two transistors connected between VREAD on the one hand, and the one bitline BL#t and BL#c on the other hand, each of these transistors being controlled by a respective pre-charge signal PREt_# and PREc_#, respectively. FIG. 14 further shows a possibility for performing the above-mentioned disconnection of the sense amplifier from the respective bitline via the above-mentioned MUX signals. In particular, according to FIG. 14, a respective transmission gate is connected into each bitline with these transmission gates being controlled by the respective MUX signal. Further, FIG. 14 shows an embodiment for the amplification unit of each sense amplifier with this exemplary amplification unit comprising a feedback inverter latch consisting of two anti-parallel connected inverters connected in this anti-parallel manner between both bitlines associated with the respective sense amplifier SA0 and SA1, respectively.

However, in addition to the switches 852 and 854 enabling connection of the respective bitline BL0t and BL0c individually to VREAD, each bitline pair associated with a common sense amplifier SA0 and SA1, respectively, has one of its bitlines, namely BL0t and BL1c, connectable to VPL via a switch 856 with the corresponding switches being controlled by DISt_0 and DISc_1, respectively. In particular, the memory cells 100 are connected to the bitlines and wordlines such that memory cells 100 associated with a common wordline are connectable to one bitline of a first one of the sense amplifiers SA0 and SA1 and one bitline of the other of the two sense amplifiers, respectively, and that only one of these two bitlines is connectable to VPL via switch 856 of the respective sense amplifier. Moreover, via switches 858 and 860, the bitline BL0t of a first one of the sense amplifiers SA0 being connectable to VPL via switch 856, is connectable to a bitline of the other pair of bitlines associated with the other sense amplifier, with this bitline BL1t not being connectable to VPL. The same applies to bitlines BL0c and BL1c in FIG. 14. These switches 858 and 860 are controlled by signals EQL0 and EQL1.

By the configuration of FIG. 14, it is possible to read out any of the memory cells in the activated bitlines and to set the correct reference voltage at the other bitlines. For example, the wordline WL0 is activateable to connect two of the memory cells 100 to bitlines BL0t and BL1t. These bitlines are connectable to each other via EQL0. The remaining bitlines BL0c and BL1c are connectable via switch 860 controlled by signal EQL1. If VL0 is activated, EQL1 may be set to short the respective two remaining bitlines BL0c and BL1c which are to serve as reference bitlines. These bitlines BL0c and BL1c together define the reference voltage. In particular, bitline BL0c is set to VREAD via switch 854 and signal PREc_0, and the other bitline, BL1c of the neighboring sense amplifier SA1, is set to VPL via switch 856 and signal DISc_1. By this measure, VREAD is connected to VPL via switches 854, 860, and 856 of sense amplifier SA1. Due to the exact matching of each of the bitlines to each other, the reference voltage thus set on bitlines BL0c and BL1c is (VREAD+VPL)/2. Therefore, the voltage adaptation process takings place at bitlines BL0t and BL1t resulting from bitline BL0 is sensible and comparable with the current reference voltage at the respective other bitlines BL0c and BL1c. Altogether, the combination of the time discrete voltage sensing concept of the above outlined embodiments with a local generation of a reference voltage as described with respect to FIG. 14, may result in an efficient on-pitch sense amplifier layout.

As has been just-mentioned, an embodiment for programming a memory cell is now described. In particular, the embodiment represents a kind of self-timed iterative programming. Of course, other concepts could also be used. However, the embodiments of FIGS. 15 to 17 as presented herein are merely intended for illustrative purposes.

Figure 15:
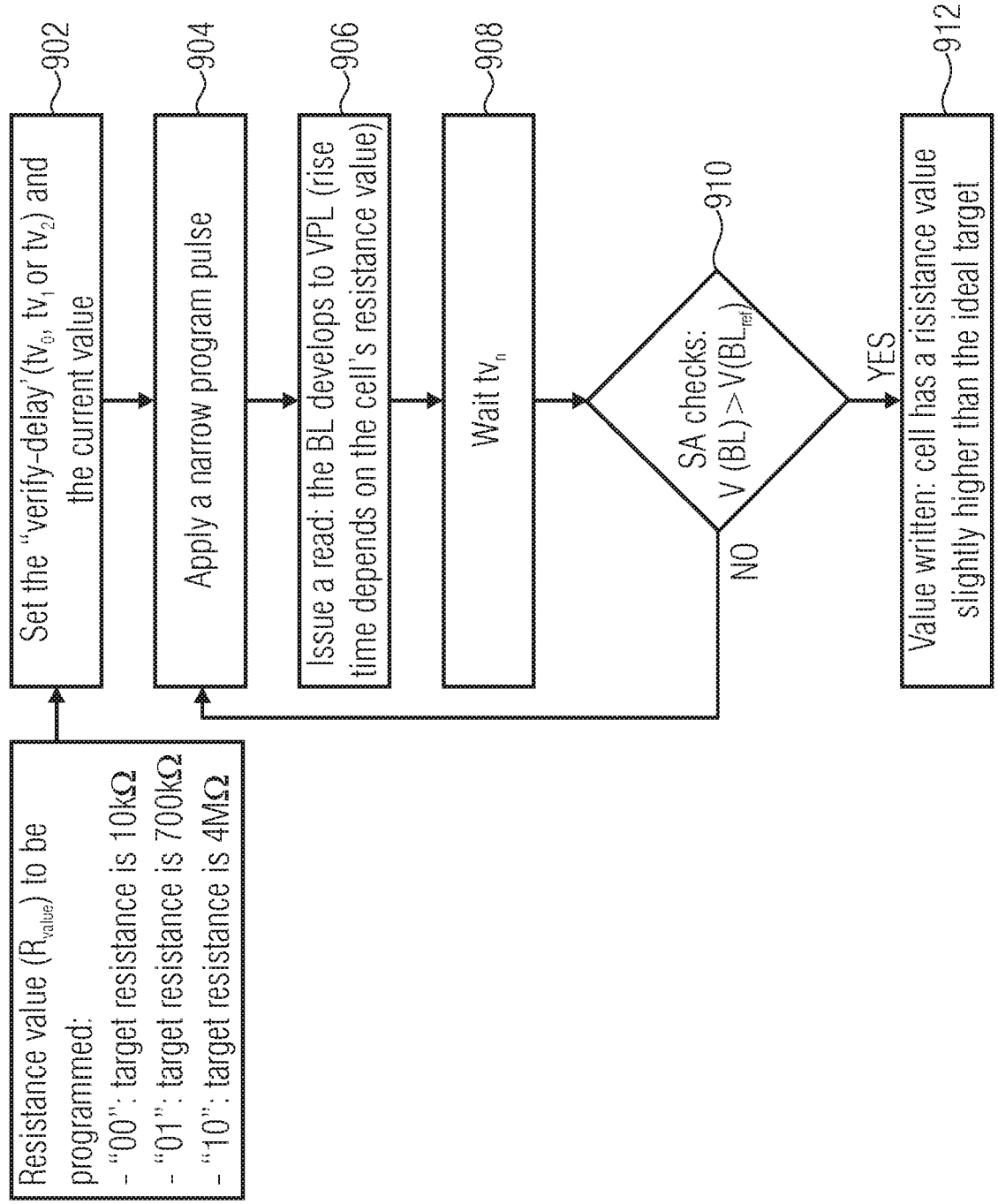
FIG. 15 shows a flow chart of a process for programming the memory state of a resistive memory cell according to an embodiment.

Firstly, the scheme principle is described with respect to FIG. 15. The process starts at step 900, where the information bits are associated with the respective target resistance value $R_{value}$ to be programmed. For example if the information bits to be stored are "00", the target resistance to be set could be 10 kΩ, as in the abovementioned embodiments. Accordingly, if the information bits are "01", the target resistance could be 700 kΩ, and if the information bits are "10", the target resistance could be 4MΩ. Of course, other embodiments are also possible. The information bit combination "11" has been left out, since the target resistance of the highest resistance value such as 1 GΩ as shown in FIG. 5, could be set without the iterative concept or process shown in FIG. 15. However, in another embodiment, the process of FIG. 15 could be used for all target resistance values possibly stored into the n-level memory cell.

Next, in step 902, the target resistance is used to derive the verify-delay $tv_0$, $tv_1$, or $tv_2$, as indicated in FIG. 5. Step 902 may, for example, involve a look-up into look-up table by means of the information bits to be stored, or by means of the target resistance value as an index. Then, in step 904, a short programming pulse, i.e., a short high voltage pulse, is applied to the memory cell to be written on. Next, in step 906, a read cycle is started in which a current adaptation process is commenced so that the voltage on the bitline develops to VPL, wherein the rise time depends on the currently set resistance values of the cells. As shown in step 908, the current adaptation process is allowed to take place for a time interval $tv_n$ with n being the current value, or the current index, pointing to information bit combination to be actually stored. In step 910, the sense amplifier then checks at time instant $tv_n$, as to whether the voltage at the bitline is higher than the bitline on the reference bitline. If this is not the case, then the process steps back to step 904, and another narrow program pulse is applied to the memory cell to be written on. However, if the result is positive in step 910, the process ends at step 912, in which case the information bits in question are written into the memory cell and the memory cell has a resistance value that is only slightly higher than the ideal target resistance value, as indicated in step 900. Of course, the pulses applied at step 904 may correspond to programming pulses or erasing pulses, i.e., their polarity may depend on the information bits to be written into the memory cell.

Figure 16:
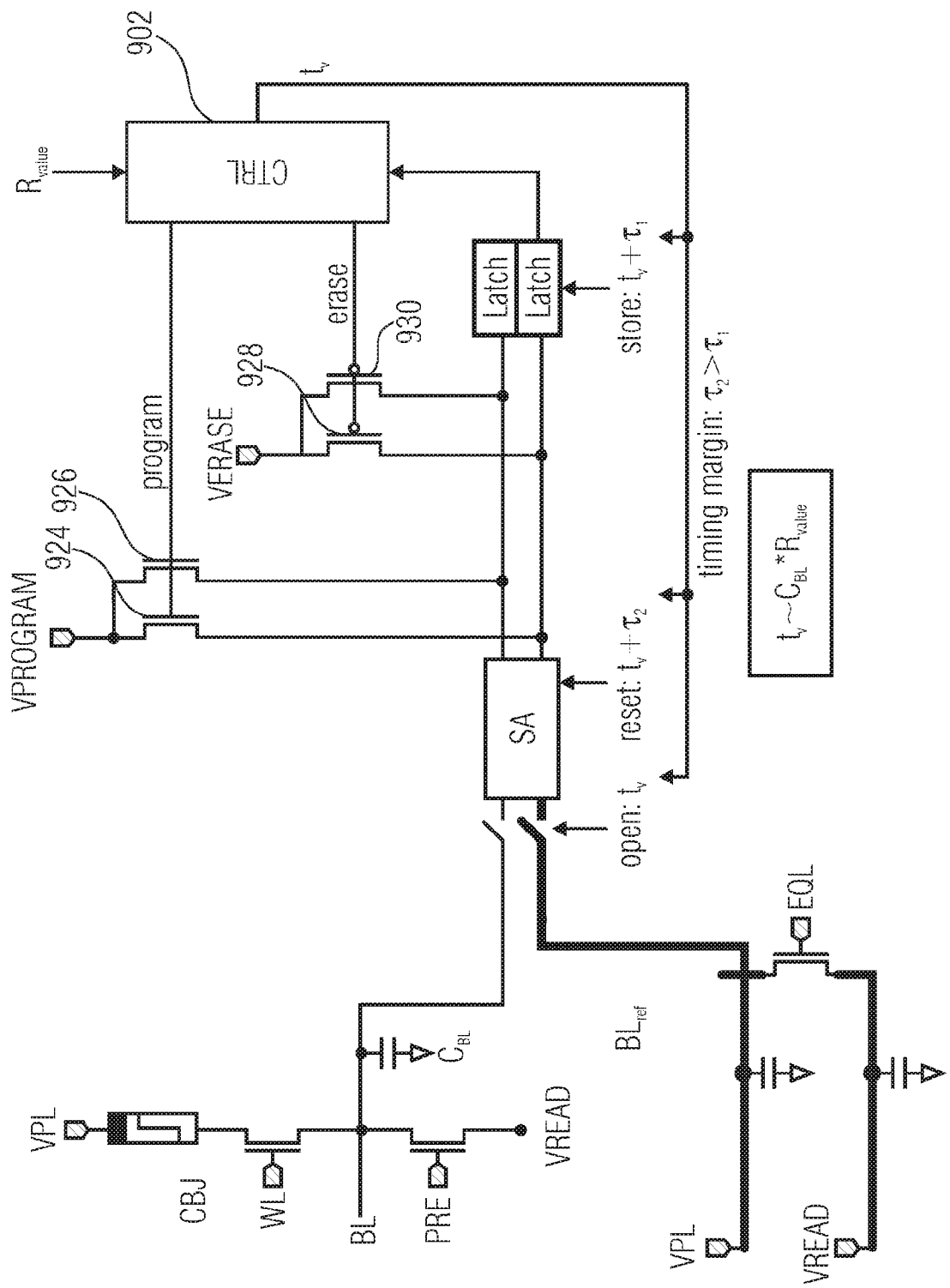
FIG. 16 shows a schematic diagram of a circuitry for performing the process of FIG. 15 according to an embodiment.

FIG. 16 shows a possible embodiment for a memory device enabling the programming process of FIG. 15, wherein the embodiment complies with the memory device of FIG. 10 as far as the portion extending from the sense amplifier to the memory cell is concerned. Therefore, this portion is not described again in FIG. 16. However, the sense amplifier is shown to have a differential output to which two latches are connected. A control circuit 902 controls four switches and is connected to the outputs of the two latches connected to the differential outputs of the sense amplifier. In particular, switches 924 and 926, as controlled by control circuit 902, are connected between the programming voltage VPROGRAM and the respective differential output lines of the sense amplifier in order to enable setting the voltages thereon to VPROGRAM, and switches 928 and 930 are connected between the erase voltage VERASE and the two differential output lines of the sense amplifier in order to enable setting these lines to the voltage VERASE. According to the functionality of FIG. 15, the control circuit 902 either activates switches 924 and 926, or switches 928 and 930, into a state where these differential output lines of the sense amplifier are connected to the bitline BL of the memory cell CBJ in step 904, in order to apply a program or erase pulse to the memory cell CBJ. The control circuit 902 then sets the time delay $t_v$, depending on the information bits or the value $R_{value}$ to be written and accordingly controls the switches connecting the sense amplifier to the bitline and the reference bitline, the reset input of the sense amplifier and the sampling input of the latches at the output side of the sense amplifier so that the switches connecting the sense amplifier to the bitline and the reference bitline open after a time interval $t_v$, the latches latch the sense amplifier output at time instant $t_v+\tau_1$, and the sense amplifier is reset and thus disconnected from the bitline and the reference bitline at time instant $t_v+\tau_2$. As indicated in FIG. 16, the time interval $t_v$ may be computed by multiplying $R_{value}$ with the capacity of the bitline $C_{BL}$.

Figure 17:
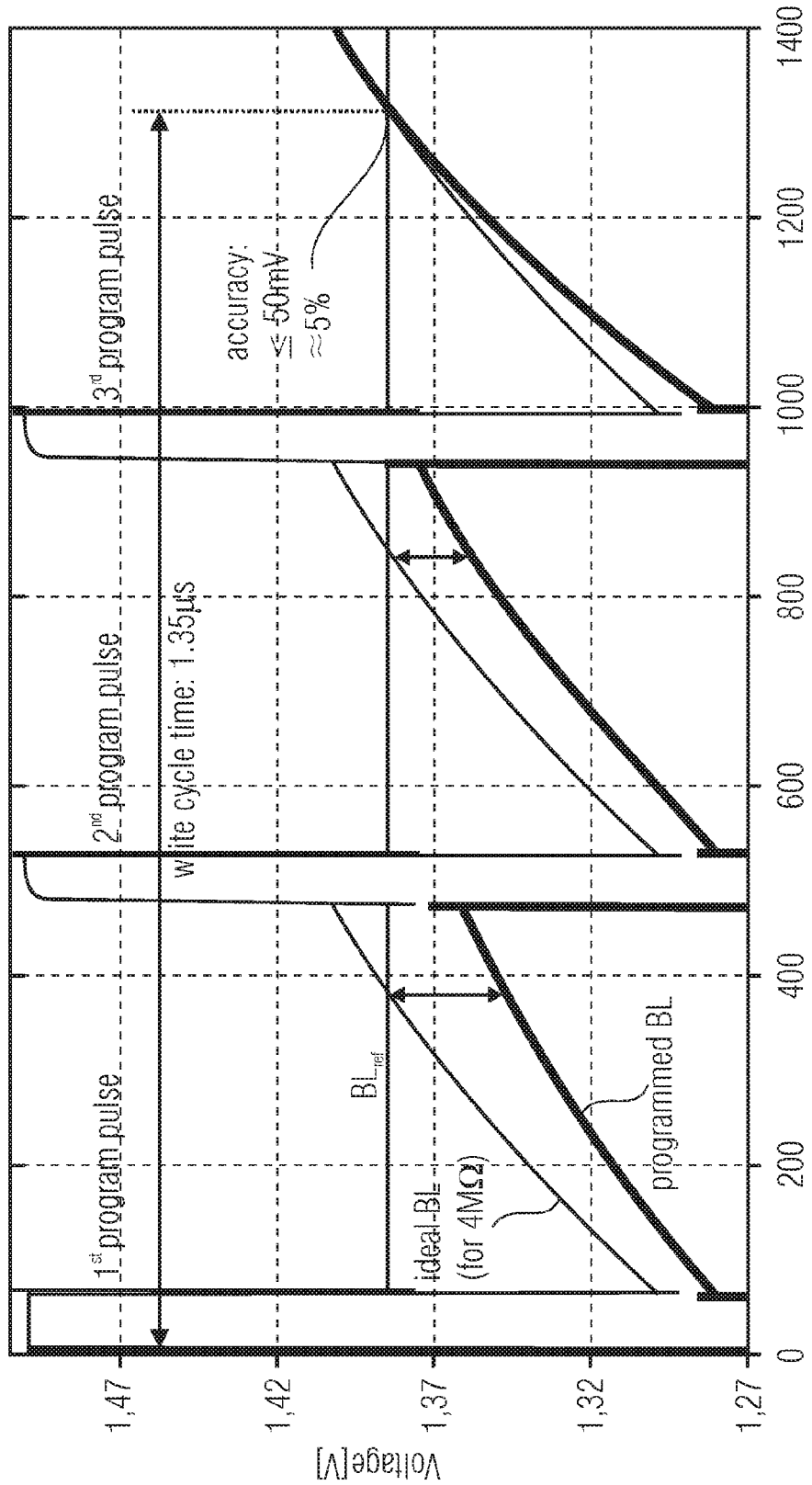
FIG. 17 shows a voltage diagram illustrating the process of FIG. 15 according to an embodiment.

The above embodiments have been tested based on a 90 nm, $4F^2$, 1T1CBJ (1-Transistor/1-Conductive Bridging Junction) 4 Mb CBRAM core with using an on-pitch time-discrete voltage sensing scheme as described above with respect to FIG. 11 and employing a bitline (BL) charge balancing reference as described with respect to FIG. 14 as well as a self-timed iterative program concept as described with respect to FIG. 15-17. Random read cycle times≈0.7 µs and random write cycle times≈1.35 µs were achieved. The resulting memory may be used in handheld and multimedia applications. As has been described above with respect to FIG. 11, according to an embodiment of a voltage sensing read concept for CBRAM cells storing 4 resistance levels, in a first step the BL voltage may beset by PRE to VREAD (1.3V). As soon as WL is activated BL may be charged up to VPL (1.5V) through the cell resistance. The time to complete this charging depends on the resistance of the memory cell (FIG. 5). $t_0$, $t_1$, and $t_2$ indicate suitable points in time when the voltage on BL is compared by an on-pitch voltage SA using the reference $BL_{ref}$. The comparison result is latched ($L_n$) after an adequate time $\tau_1$, and the SA is reset after $\tau_2$. While the BL-charging is continued this sequence is repeated N−1 times (N is the number of cell resistance levels). The above table depicted the mapping of $L_0$, $L_1$, and $L_2$ to 4 resistance levels representing the logic states. $L_n$ is "1" if the voltage on BL is higher than the voltage on $BL_{ref}$ at the time $t_n$. A random read cycle time of $t_2=0.7$ µs may be achieved. As was described with respect to FIG. 14, if WL0 is activated, EQL1 shorts two BLs which have been set to VREAD (PREc_0) and VPL (DISc_1). If WL1 is activated EQL0 is used. Due to exactly matching BLs the reference is (VREAD+VPL)/2. In other words, two different complimentary bitlines currently not used BLca and BLcb may be loaded with $V_{read}$ and the voltage of VPL and if both bitlines are connected, a charge equalization process can be carried out between the bitlines, wherein the reference voltage thus generated is $(V_{read}+V_{PL})/2$. Combining the time discrete voltage sensing concept with the local generation of a reference voltage may lead to an efficient on-pitch SA layout. As far as the programming is concerned, an iterative self-timed concept according to FIG. 15-17 may be used to program multilevel CBRAM cells. Narrow program pulses are followed by verifying reads until the SA flips after a time $t_v$ that is characteristic for the resistance value to be programmed. FIG. 16 showed the combination of the process of FIG. 15 with the read circuits. Adequate timing margins should be used to latch the SA result $(t_v+\tau_1)$ and reset it $(t_v+\tau_2)$. Depending on the resistance value to be written, a CTRL circuit initiates program or erase operations. In FIG. 9 a 3-step program sequence is displayed: For the first two steps the cumulated current applied to the cell is not sufficient to flip the SA. During the verifying read the BL charging is slower than an ideal BL connected to a target cell resistance. After the third program the resistance of the cell is small enough and the SA can flip. Random write cycle times of 1.35 µs with an accuracy of 5% for the resistance states are achievable. Smaller program pulses require more programming steps but increase precision.

Lastly, the following should be noted with respect to the examples given above. Although not described in further detail, the sampling times $t_i$ may, for example, be multiples of a clock cycle available on the memory device like a ring oscillator. Further, chalcogenide material (ion conductor) may be understood, for example, as any compound containing sulphur, selenium, germanium and/or tellurium. The ion conducting material is, for example, a compound, that is made of a chalcogenide and at least one metal of the group I or group II of the periodic system, for example, arsene-trisulfide-silver. Alternatively, the chalcogenide material contains germanium-sulfide (GeS), germanium-selenide (GeSe), tungsten oxide ($WO_x$), copper sulfide (CuS) or the like. The ion conducting material may also be a solid state electrolyte. Furthermore, the ion conducting material can be made of a chalcogenide material containing metal ions, wherein the metal ions can be made of a metal, which is selected from a group consisting of silver, copper and zinc or of a combination or an alloy of these metals.

Further, as already noted above, although the above embodiments related to a resistive n-level memory cell, with the embodiments exploiting the discharge behavior upon appliance of a voltage across the memory cell in order to determine the memory state based upon the change of the memory cell's voltage during the charge or discharge, it is noted that the examples presented above are merely for illustrative purposes in that, for example, the type of memory cell and the number of possible memory states may be changed. For example, although the figures show a CBRAM cell as an example for a resistive memory cell, the embodiments may also transferto other types of resistive memory devices like PCRAM devices, or ORAM devices.

Additionally, the latches used in the above embodiments may be varied. In other words, other latch circuits may be used in place of the latches shown.

Finally, as far as the numbering of the first and the second electrodes 101 and 102 is concerned it is noted that the embodiments using these reference numbers may readily transfer to a case where the electrodes are switched. Thus, in particular, besides the connection of the voltage determining means 202 with both electrodes, the voltage determining means may solely connect to one of electrodes 101 and 102, i.e. 101 or 102.

Depending on an actual implementation, the above embodiments can be implemented in hardware or in software. Therefore, they also relate to a computer program, which can be stored on a computer-readable medium such as a CD, a disk or any other data carrier. These embodiments define, therefore, also a computer program having a program code which, when executed on a computer, performs the above methods described in connection with the above figures.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method for determining a memory state of a resistive n-level memory cell where n is a fixed integer greater than 2, the method comprising:
   charging or discharging a read capacity of the memory cell by applying a voltage between a first electrode and a second electrode of the memory cell;
   comparing a voltage at the second electrode to a fixed reference voltage to obtain a comparison signal;
   sampling the comparison signal or a latched version thereof at n−1 time instants during the charge or discharge of the read capacity to obtain sampling values; and
   determining the memory state of the memory cell based upon the sampling values.

2. The method according to claim 1, wherein a potential of the first electrode is kept constant while charging or discharging the read capacity so that a potential of the second electrode performs an adaptation process during the charging or discharging of the read capacity, the adaptation process adapting the potential of the second electrode to the potential of the first electrode.

3. The method according to claim 1, wherein the resistive n-level memory cell is configured such that a time duration of a voltage adaptation process between the first and second electrodes during the charging or discharging depends on the memory state of the memory cell, and the time instants are separate points in time, where a voltage at the second electrode varying due to the voltage adaptation process crosses the fixed reference voltage in any case independently of an actual memory state the memory cell has among n possible memory states.

4. The method according to claim 1, wherein the comparison signal is latched in a latch circuit so as to maintain its value during times of non-changes of the comparison signal, a state of the latch circuit defining the latched version of the comparison signal.

5. The method according to claim 1, wherein a sense amplifier performing the comparison is disconnected from the second electrode depending on the latched version of the comparison signal.

6. The method according to claim 1, wherein the sampling is performed on the comparison signal and the sample values are latched, wherein the determining of the memory state comprises logically combining the latched sample values.

7. The method according to claim 1, wherein the sampling is performed on the latched version of the comparison signal, wherein n is multiple of 2, wherein n=2m, and wherein determining comprises:
   initializing first to mth latch circuits to a first logical value;
   changing the first logical value of the mth latch circuit to a second logical value depending on the sample values of the first n/2 time instants; and
   changing the first logical value of (m−1)th latch circuit to a second logical value depending on a logical value of the mth latch circuit, the sample value of the (n/2+1)th time instants, and the sample value at a first time instant.

8. The method according to claim 4, wherein the fixed reference voltage is generated by a circuit receiving the voltage applied between the first and second electrode of the memory cell.

9. A method for determining a memory state of a resistive n-level memory cell where n is a fixed integer greater than 2, the method comprising:
   charging or discharging a read capacity of the memory cell by applying a voltage between a first electrode and a second electrode of the memory cell;
   comparing a voltage at the second electrode at a first time instant during the charging or discharging of the read capacity with a fixed reference voltage to obtain a first comparison result;
   determining the memory state of the resistive n-level memory cell by:
      if the first comparison result assumes a first value, comparing the voltage at the second electrode at a second time instant following the first time instant during the charging or discharging of the read capacity with the fixed reference voltage to obtain a second comparison result and determining the memory state of the resistive n-level memory cell based upon the first and second comparison results; and
      if the first comparison result assumes a second value, prohibiting any further comparisons of the voltage at the second electrode during the charging or discharging of the read capacity and determining a resistive n-level memory state of the resistive n-level memory cell based upon the first comparison result.

10. The method according to claim 9, wherein determining the resistive n-level memory state of the memory cell based upon the first and second comparison results comprises:
   if the second comparison result assumes the first value, comparing the voltage at the second electrode at a third time instant following the second time instant during the charging or discharging of the read capacity with the fixed reference voltage to obtain a third comparison result and determining the memory state of the resistive n-level memory cell based upon the first, second and third comparison results; and if the second comparison result assumes the second value, prohibiting any further comparisons of the voltage at the second electrode during the charging or discharging of the read capacity and determining the memory state of the resistive n-level memory cell based upon the first and second comparison results.

11. The method according to claim 9, further comprising providing a timing signal defining the first, second and third time instants, wherein prohibiting any further comparisons comprises inhibiting a passage of the timing signal to a switch circuit connected between the n-level memory cell and a sense amplifier performing the comparisons.

12. The method according to claim 9, further comprising:
initializing a first and second latch circuit to a first logical value, wherein,
determining the memory state of the resistive n-level memory cell based upon the first comparison value comprises changing the first logical value of the first and second latch circuit to a second logical value responsive to the first comparison result assuming the first value;
determining the memory state of the resistive n-level memory cell based upon the first and second comparison results if the second comparison result assumes the second value, comprises changing the first logical value of the first latch circuit to the second logical value; and
determining the memory state of the memory cell based upon the first, second and third comparison results, comprises changing the first logical value of the second latch circuit to the second logical value if the third comparison result assumes the second value.

13. A memory device comprising:
a resistive n-level memory cell where n is a fixed integer greater than 2;
a voltage supply unit configured to generate a voltage between a first electrode and a second electrode of the memory cell;
a sense amplifier comprising a sense input coupled to the second electrode, a reference voltage input coupled to a fixed reference voltage, and an output;
a timing circuit configured to output a timing signal defining a sequence of n−1 time instants during a charge or discharge of a read capacity of the resistive n-level memory cell; and
an evaluation circuit comprising an input coupled to the output of the sense amplifier and being controlled by the timing signal to determine a memory state of the n-level memory cell based upon the output of the sense amplifier at each of the n−1 time instants.

14. The memory device according to claim 13, further comprising a latch circuit coupled between the output of the sense amplifier and the input of the evaluation circuit.

15. The memory device according to claim 14, further comprising a switch coupled between the second electrode and a second input of the sense amplifier, the switch being controlled depending on a state of the latch circuit.

16. The memory device according to claim 14, wherein n is a multiple of 2, wherein n=2m, and wherein the evaluation circuit comprises:
a most significant bit latch circuit;
a secondary significant bit latch circuit;
a first switching circuit responsive to the first n/2 time instants to influence the most significant bit latch circuit and the secondary significant bit latch circuit depending on a state of the latch circuit;
a second switching circuit being responsive to the (n/2+1)th time instant to influence the secondary significant bit latch circuit depending on a state of the latch circuit; and
a third switching circuit being responsive to the n/2th time instant and a state of the most significant bit latch circuit to influence the secondary significant bit latch circuit depending on a state of the latch circuit.

17. The memory device according to claim 13, wherein n is a multiple of 2, wherein the evaluation circuit comprises (n−1) latch circuits each connectable to the output of the sense amplifier and each being responsive to a different one of the (n−1) time instants to latch circuit a signal present at the output of the sense amplifier, the evaluation circuit further comprising a mapper mapping a content of the (n−1) latch circuits to a m-bit value with 2 m=n.

18. The memory device according to claim 13, wherein the resistive n-level memory cell comprises a CBRAM, PCRAM or ORAM cell.

19. The memory device according to claim 13, wherein
the sense amplifier comprises a latch circuit formed by inverters coupled in an anti-parallel manner between a first bit line to which the resistive n-level memory cell is connectable and a second bit line to which a second resistive n-level memory cell is connectable,
the memory device further comprising a further sense amplifier with a latch circuit formed by inverters coupled in an anti-parallel manner between a third bit line to which a third resistive n-level memory cell is connectable and a fourth bit line to which a fourth resistive n-level memory cell is connectable,
the connection of the resistive n-level memory cell and the third resistive n-level memory cell to the first and third bit lines, respectively, being controllable via a first common word line,
the connection of the second resistive n-level memory cell and the fourth resistive n-level memory cell to the second and fourth bit lines, respectively, being controllable via a second common word line, and
each of the first to fourth bit lines being connectable to a first supply potential via first to fourth switches, the second and third bit lines are connectable to a second supply potential via fifth and sixth switches and the first and third bit lines on the one hand and the second and fourth bit lines on the other hand are connectable to each other via seventh and eighth switches such that
a reference voltage is settable at the second and fourth bit lines while the first resistive n-level memory and the third resistive n-level memory are connected to the first and third bit lines, respectively, and
the reference voltage is settable at the first and third bit lines while the second resistive n-level memory and the fourth resistive n-level memory are connected to the second and fourth bit lines, respectively.

20. An apparatus for determining a memory state of a resistive n-level memory cell where n is a fixed integer greater than 2, the apparatus comprising:
means for charging or discharging a read capacity of the memory cell by applying a voltage between a first electrode and a second electrode of the memory cell;
means for comparing a voltage at the second electrode to a fixed reference voltage to obtain a comparison signal;
means for sampling the comparison signal or a latched version thereof at n−1 time instants during the charge or discharge of a read capacity to obtain sampling values, and
means for determining the memory state of the memory cell based upon the sampling values.

21. The apparatus according to claim 20, wherein the resistive n-level memory cell is configured such that a time duration of a voltage adaptation process between the first and second electrodes during the charging or discharging depends on the memory state of the memory cell, and the n−1 time instants lie separate points in time from each other, where the voltage at the second electrode varying due to the voltage adaptation process crosses the fixed reference voltage in any case independent of an actual memory state the memory cell has among n possible memory states.

22. The apparatus according to claim 20, wherein the means for comparing comprises a sense amplifier and the apparatus further comprises means for disconnecting the sense amplifier from the second electrode depending on the latched version of the comparison signal.

23. An apparatus for determining a memory state of an resistive n-level memory cell where n is a fixed integer greater than 2, the apparatus comprising:
  first means for charging or discharging a read capacity of the memory cell by applying a voltage between a first electrode and a second electrode of the resistive memory cell;
  second means for 1) comparing a voltage at the second electrode at a first time instant during the charging or discharging of the read capacity with a fixed reference voltage to obtain a first comparison value; 2) if the first comparison value assumes a first value, comparing the voltage at the second electrode at a second time instant following the first time instant during the charging or discharging of the read capacity with the fixed reference voltage to obtain a second comparison value and determining the memory state of the resistive n-level memory cell based upon the first and second comparison values; and 3) if the first comparison value assumes the second value, prohibiting any further comparisons of the voltage at the second electrode during the charging or discharging of a read capacity and determining the resistive n-level memory state of the resistive n-level memory cell based upon the first comparison value.

24. The apparatus according to claim 23, wherein the second means is further configured to
  if the second comparison value assumes the first value, compare the voltage at the second electrode at a third time instant following the second time instant during the charging or discharging of the read capacity with the fixed reference voltage to obtain a third comparison value and determine the memory state of the resistive n-level memory cell based upon the first, second and third comparison values; and
  if the second comparison value assumes the second value, prohibit any further comparisons of the voltage at the second electrode during the charging or discharging of the read capacity and determine the memory state of the resistive n-level memory cell based upon the first and second comparison values.

* * * * *